United States Patent
Chang et al.

(10) Patent No.: US 9,280,026 B2
(45) Date of Patent: Mar. 8, 2016

(54) PIXEL STRUCTURE AND DISPLAY PANEL

(71) Applicant: AU Optronics Corp., Hsin-Chu (TW)

(72) Inventors: Chi-Ho Chang, Hsin-Chu (TW); Seok-Lyul Lee, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 31 days.

(21) Appl. No.: 14/494,552

(22) Filed: Sep. 23, 2014

(65) Prior Publication Data

US 2015/0277199 A1    Oct. 1, 2015

(30) Foreign Application Priority Data

Mar. 28, 2014 (TW) .............................. 103111817 A

(51) Int. Cl.
| | |
|---|---|
| *G02F 1/136* | (2006.01) |
| *G02F 1/1362* | (2006.01) |
| *H01L 27/12* | (2006.01) |
| *H01L 29/786* | (2006.01) |
| *G02F 1/1368* | (2006.01) |
| *G02F 1/1333* | (2006.01) |
| *G02F 1/1339* | (2006.01) |

(52) U.S. Cl.
CPC ........ *G02F 1/136286* (2013.01); *G02F 1/1339* (2013.01); *G02F 1/1368* (2013.01); *G02F 1/13338* (2013.01); *G02F 1/133345* (2013.01); *H01L 27/124* (2013.01); *H01L 27/1248* (2013.01); *H01L 29/7869* (2013.01); *H01L 29/78669* (2013.01); *H01L 29/78678* (2013.01); *G02F 2201/40* (2013.01)

(58) Field of Classification Search
CPC .................. H01L 29/78669; H01L 29/78678; H01L 29/7869; H01L 29/124; H01L 29/1248; G02F 1/1368; G02F 1/1339; G02F 1/13334; G02F 1/133555; G02F 1/136286
See application file for complete search history.

(56) References Cited

U.S. PATENT DOCUMENTS

| | | | |
|---|---|---|---|
| 7,795,616 B2 | 9/2010 | Yamazaki | |
| 8,451,418 B2 | 5/2013 | Gotoh | |
| 2003/0164912 A1* | 9/2003 | Eguchi | G02F 1/133555 349/113 |
| 2005/0030454 A1* | 2/2005 | Jang | G02F 1/133555 349/114 |
| 2007/0058116 A1* | 3/2007 | Lee, II | G02F 1/133555 349/114 |
| 2007/0195236 A1* | 8/2007 | Kim | G02F 1/13439 349/114 |
| 2013/0256678 A1* | 10/2013 | Nishikawa | H01L 27/124 257/72 |
| 2014/0217411 A1* | 8/2014 | Jiang | H01L 27/124 257/59 |
| 2014/0346496 A1* | 11/2014 | Ro | H01L 27/1248 257/43 |
| 2015/0116606 A1* | 4/2015 | Xiong | G06F 3/0412 349/12 |
| 2015/0228675 A1* | 8/2015 | Takanishi | G02F 1/133345 257/43 |

* cited by examiner

*Primary Examiner* — James Dudek
(74) *Attorney, Agent, or Firm* — Winston Hsu; Scott Margo

(57) ABSTRACT

A pixel structure and a display panel are provided. The pixel structure uses an insulation protrusion with a drain electrode extending thereon or a single-layered conductive protrusion as an electrical connection interface between the drain electrode and a pixel electrode. The aperture ratio and resolution are increased for no contact hole is required to be formed in the passivation layer.

20 Claims, 20 Drawing Sheets

PIXEL STRUCTURE AND DISPLAY PANEL

BACKGROUND OF THE INVENTION

1. Field of the Invention

The present invention relates to a pixel structure and a display panel, and more particularly, to a pixel structure and a display panel that use a protrusion structure as an electrical connection interface between the drain electrode of a thin film transistor device and a pixel electrode.

2. Description of the Prior Art

The display panel includes a plurality of pixel structure, and each pixel structure includes display components such as thin film transistor device, storage capacitor and pixel electrode. In a conventional display panel, the thin film transistor device is covered with a passivation layer for protection. The pixel electrode needs to be electrically connected to the drain electrode of the thin film transistor device, thus the passivation layer must have a contact hole exposing the drain electrode, and the pixel electrode is filled into the contact hole and in contact with the drain electrode. Considering process limit and alignment bias, the dimension (size) of the contact hole must be between 20 micrometers and 25 micrometers, or even greater, which sacrifices the aperture ratio. Particularly for small size display panel, the formation of the contact hole makes it difficult to increase the aperture ratio and resolution.

SUMMARY OF THE INVENTION

It is therefore one of the objectives of the present invention to provide a pixel structure and a display panel to increase the aperture ratio and resolution.

According to an embodiment of the present invention, a pixel structure is provided. The pixel structure includes a first substrate, a thin film transistor device, a first insulating protrusion, a first dielectric film, a passivation layer and a first electrode. The thin film transistor device is disposed on the first substrate, and the thin film transistor device includes a gate electrode, an active layer, a gate insulating layer, a source electrode and a drain electrode. The first insulating protrusion is disposed on the first substrate, wherein the first insulating protrusion has a sidewall and a top surface, and the drain electrode at least covers a portion of the sidewall of the first insulating protrusion. The first dielectric film is disposed on the first substrate, wherein the first dielectric film covers the thin film transistor device and exposes a portion of the drain electrode. The passivation layer is disposed on the first dielectric film, wherein the passivation layer and the first dielectric film at least partially exposes the drain electrode disposed on the sidewall of the first insulating protrusion. The first electrode is disposed on the passivation layer and electrically connected to the drain electrode exposed by the passivation layer.

According to another embodiment of the present invention, a display panel is provided. The display panel includes the aforementioned pixel structure, a second substrate disposed opposite to the first substrate, and a display medium layer interposed between the first substrate and the second substrate.

According to still another embodiment of the present invention, a pixel structure is provided. The pixel structure includes a first substrate, a thin film transistor device, a first single-layered conductive protrusion, a first dielectric film, a passivation layer and a first electrode. The thin film transistor device is disposed on the first substrate, and the thin film transistor device includes a gate electrode, an active layer, a gate insulating layer, a source electrode and a drain electrode. The first single-layered conductive protrusion is disposed on the first substrate, wherein the first single-layered conductive protrusion has a sidewall, a bottom surface and a top surface, and the first single-layered conductive protrusion is electrically connected to the drain electrode. The first dielectric film is disposed on the first substrate, wherein the first dielectric film covers the thin film transistor device and partially exposes the first single-layered conductive protrusion. The passivation layer is disposed on the first dielectric film, wherein the passivation layer at least partially exposes the first single-layered conductive protrusion. The first electrode is disposed on the passivation layer and electrically connected to the first single-layered conductive protrusion exposed by the passivation layer.

According to another embodiment of the present invention, a display panel is provided. The display panel includes the aforementioned pixel structure, a second substrate disposed opposite to the first substrate, and a display medium layer interposed between the first substrate and the second substrate.

The pixel structure and the display panel of the present invention use an insulating protrusion with extending drain electrode or a single-layered conductive protrusion as an electrical connection interface between the pixel electrode and the drain electrode, which does not require formation of contact hole in the passivation and thus can significantly increase the aperture ratio and resolution.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
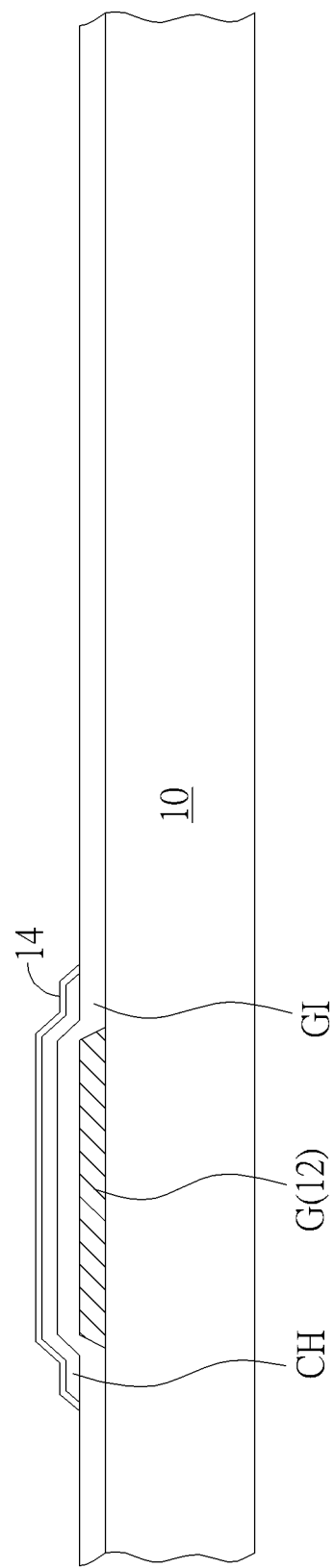
FIGS. 1-6 are schematic diagrams illustrating a method of forming a pixel structure according to a first embodiment of the present invention.
Figure 4:
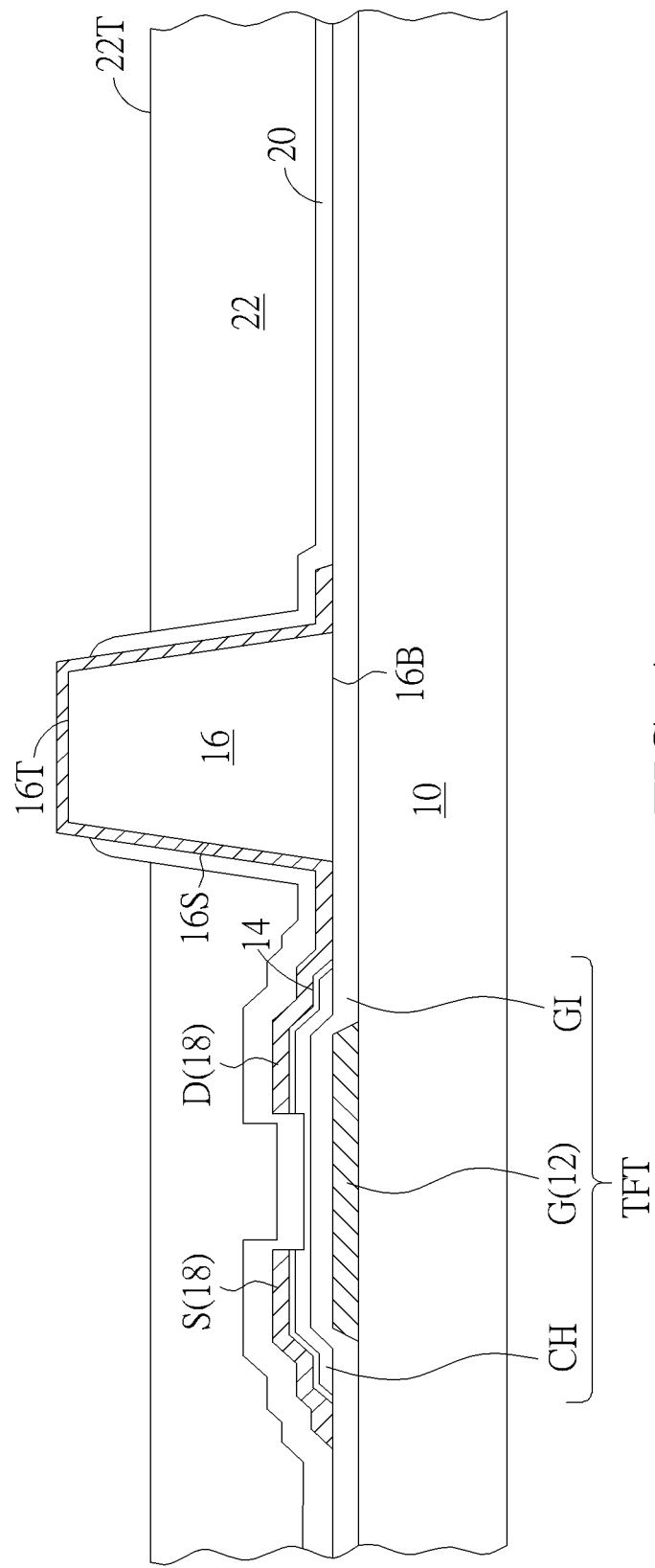
Figure 5:
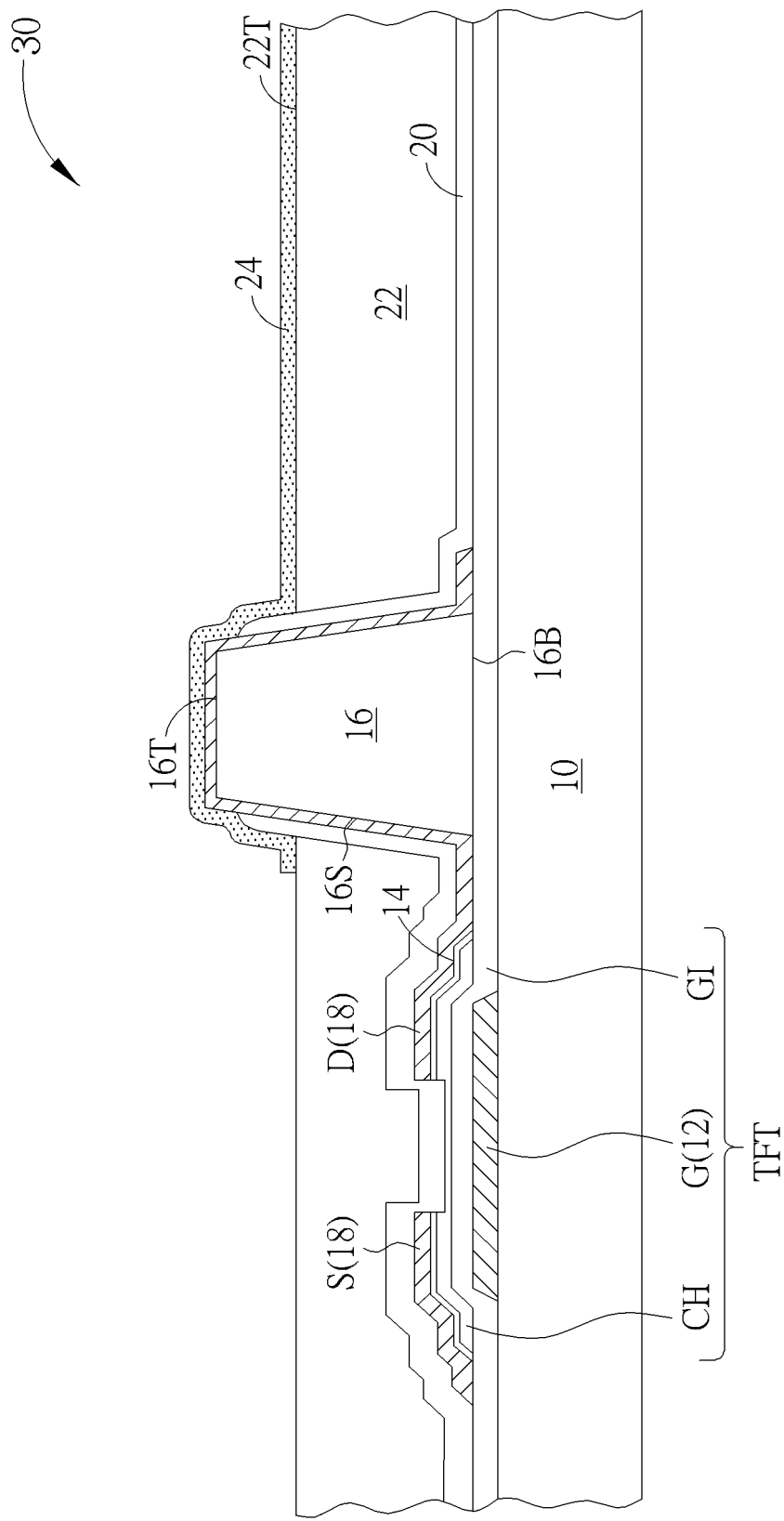
Figure 6:
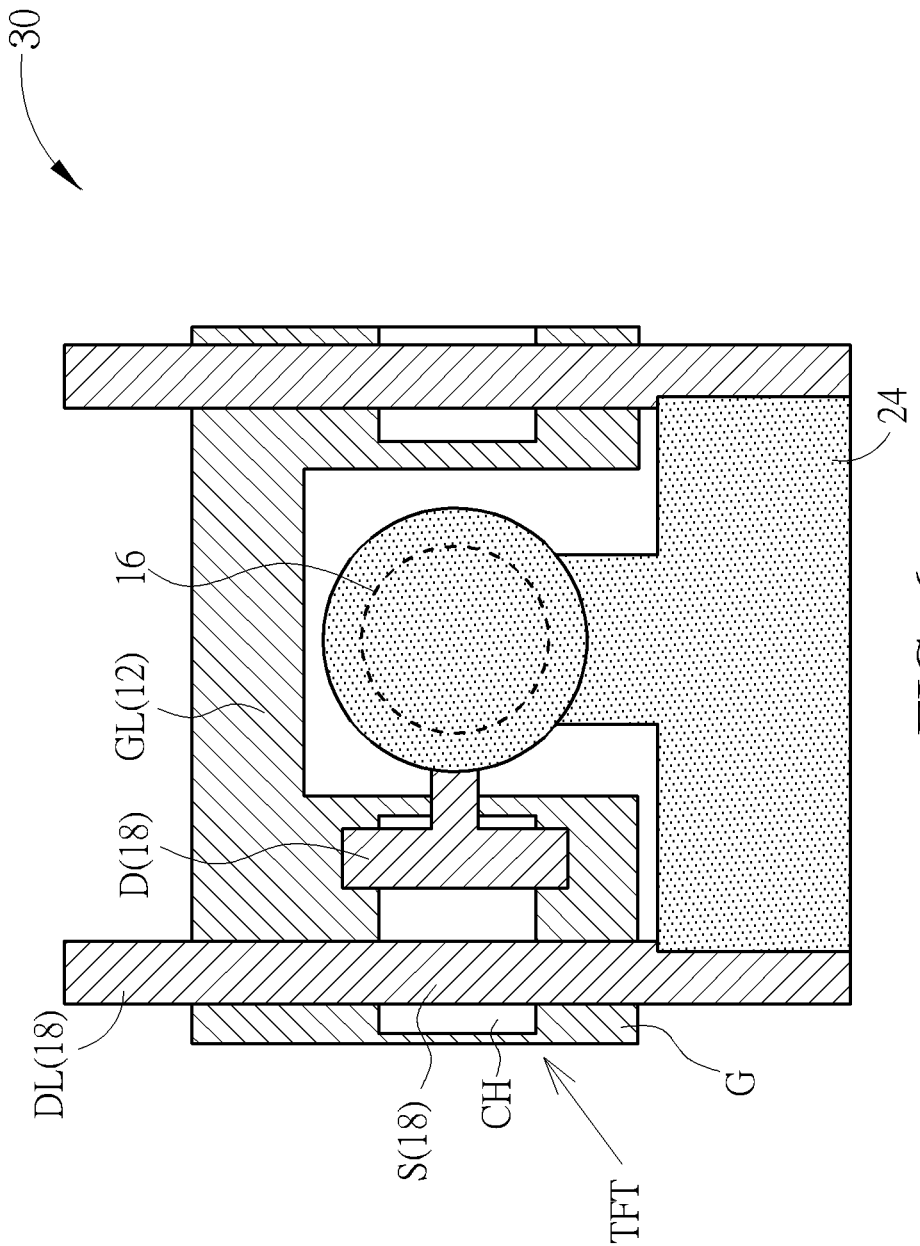

Refer to FIGS. 1-6. FIGS. 1-6 are schematic diagrams illustrating a method of forming a pixel structure according to a first embodiment of the present invention, where FIGS. 1-5 are cross-sectional views and FIG. 6 is a top view. As shown in FIG. 1, a first substrate 10 is provided. The first substrate 10 may be various types of rigid or flexible substrates e.g. a glass substrate, a plastic substrate or a quartz substrate. Then, a first patterned conductive layer 12 is formed on the first substrate 10. The first patterned conductive layer 12 may include a gate electrode G and a gate line GL (shown in FIG. 6) electrically connected to the gate electrode G. The first patterned conductive layer 12 may be a non-transparent (opaque) patterned conductive layer, and the material may be metal or alloy e.g. gold (Au), silver (Ag), copper (Cu), aluminum (Al), titanium (Ti), molybdenum (Mo) or alloy thereof, or other suitable non-transparent conductive materials. Alternatively, the first patterned conductive layer 12 may be a transparent patterned conductive layer, and the material may be, for example, indium tin oxide (ITO), indium zinc oxide (IZO) or other suitable transparent conductive materials. Subsequently, a gate insulating layer GI and an active layer CH are sequentially formed on the first patterned conductive layer 12. The gate insulating layer GI covers the gate electrode G, and the material may be inorganic insulating material e.g. silicon oxide, silicon nitride or silicon oxynitride, organic insulating material or organic/inorganic hybrid (mixing) insulating material. In addition, the gate insulating layer GI may be a single-layered structure or a multi-layered stacking structure. The active layer CH is formed on the gate insulating layer GI and substantially corresponding to the gate electrode G. The active layer CH is served as the channel layer of thin film transistor device, and is electrically insulated from the gate electrode G by the gate insulating layer GI. In this embodiment, the material of the active layer CH may be amorphous silicon, but not limited thereto. The material of the active layer CH may include other types of silicon materials e.g. polycrystalline silicon, single crystalline silicon, micro crystalline silicon or nano crystalline silicon, oxide semiconductor material e.g. indium gallium zinc oxide (IGZO), indium gallium oxide (IGO), indium zinc oxide (IZO), indium tin oxide (ITO), titanium oxide (TiO), zinc oxide (ZnO), indium oxide (InO) or gallium oxide (GaO), or other suitable semiconductor materials. Furthermore, a heavily doped semiconductor layer 14 may be optionally formed on the active layer CH to improve the ohmic contact between the active layer CH and source electrode/drain electrode to be formed later. The active layer CH and the heavily doped semiconductor layer 14 may be patterned by the same patterning process, but not limited thereto.

Figure 2:
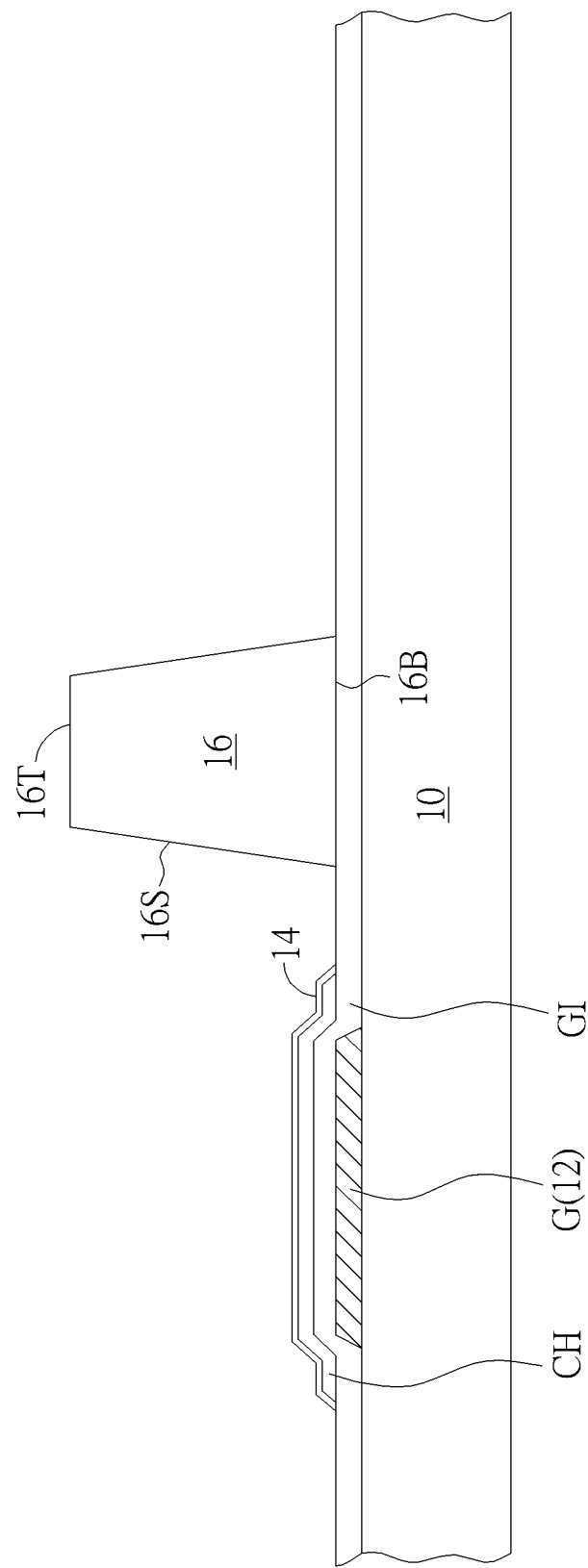

As shown in FIG. 2, a first insulating protrusion 16 is formed on the first substrate 10. The first insulating protrusion 16 is formed on the gate insulating layer GI, for example, where the first insulating protrusion 16 has a sidewall 16S, a top surface 16T and a bottom surface 16B, and the bottom surface 16B is in contact with the gate insulating layer GI. In this embodiment, the bottom surface 16B may be larger than the top surface 16T, and the sidewall 16S is an inclined sidewall, i.e. the cross-sectional shape of the first insulating protrusion 16 is approximately a trapezoid shape, but not limited thereto. In addition, the material of the first insulating protrusion 16 is preferably, but not limited to, selected from organic material such as organic photosensitive material (e.g. photoresist), so that the first insulating protrusion 16 can be formed by an exposure and development process. Also, the height of the first insulating protrusion 16 may be greater than 1 micrometer e.g. 3 micrometers, but not limited thereto.

Figure 3:
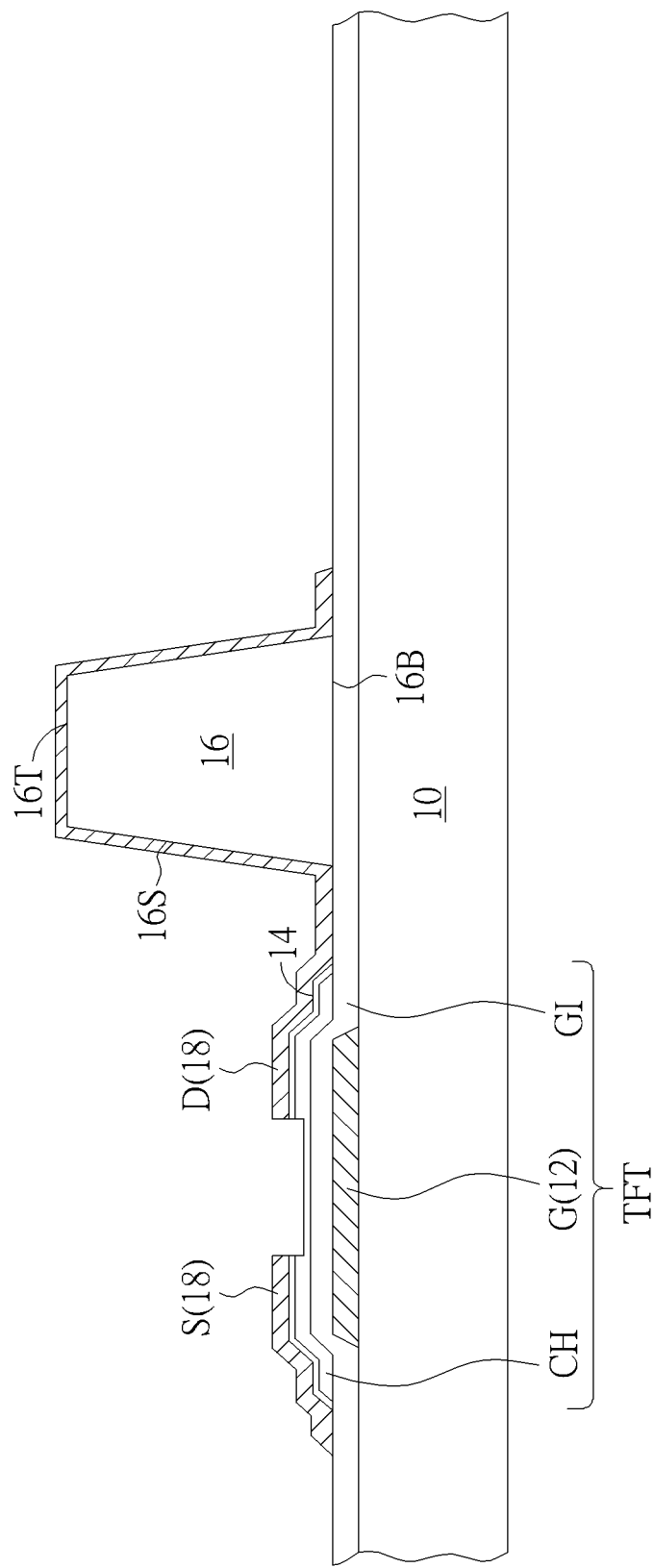

As shown in FIG. 3, a conductive layer (not shown) is formed on the first substrate 10, and a patterning process e.g. an etching process is performed on the conductive layer to form a second patterned conductive layer 18, and the heavily doped semiconductor layer 14 may be further patterned as well as the conductive layer to form two heavily doped semiconductor layers 14 corresponding to two opposite side of the gate electrode G and partially overlapping the gate electrode G. The second patterned conductive layer 18 includes a source electrode S, a drain electrode D and a data line DL (as shown in FIG. 6), where the source electrode S is disposed on one of the heavily doped semiconductor layers 14 disposed on one side of the gate electrode G, while the drain electrode D is disposed on the other one of the heavily doped semiconductor layers 14 disposed on the opposite side of the gate electrode G. In addition, the drain electrode D is extended to at least cover a portion of the sidewall 16S. The drain electrode D may be further extended to cover at least a portion of the top surface 16T of the first insulating protrusion 16. In this embodiment, the drain electrode D covers the entire sidewall 16S and the entire top surface 16T of the first insulating protrusion 16, but not limited thereto. In an alternative embodiment, the drain electrode D may only cover a portion of the sidewall 16S and a portion of the top surface 16T of the first insulating protrusion 16, or may only cover a portion of the sidewall 16S of the first insulating protrusion 16 without covering the top surface 16T of the first insulating protrusion. The gate electrode G, the active layer CH, the gate insulating layer GI, the heavily doped semiconductor layers 14, the source electrode S and the drain electrode D form a thin film transistor device TFT. In this embodiment, a bottom gate type thin film transistor device is selected as an example of the thin film transistor device TFT, but not limited thereto. The thin film transistor device TFT may be a top gate type thin film transistor device or other types of thin film transistor devices e.g. island stop (IS) type thin film transistor device, coplanar thin film transistor device. The second patterned conductive layer 18 may be a non-transparent patterned conductive layer or a transparent patterned conductive layer, and the material of the second patterned conductive layer 18 may be the same as or different from that of the first patterned conductive layer 12. As described, since the sidewall 16S of the first insulating protrusion 16 is an inclined sidewall, the drain electrode D can be easily formed on the sidewall 16S and extended to the top surface 16T without having broken line issue.

As shown in FIG. 4, a first dielectric film 20 is formed on the first substrate 10. The first dielectric film 20 covers the thin film transistor device TFT and exposes a portion of the drain electrode D. Specifically, in this embodiment, the first dielectric film 20 covers a portion of the drain electrode D disposed on the sidewall 16S of the first insulating protrusion 16, and at least exposes a portion of the drain electrode D disposed on the top surface 16T and/or the other portion of the drain electrode disposed on the sidewall 16S of the first insulating protrusion 16. The material of the first dielectric film 20 may be inorganic insulating material e.g. silicon oxide, silicon nitride or silicon oxynitride, organic insulating material or organic/inorganic hybrid (mixing) insulating material. Subsequently, a passivation layer 22 is formed on the first dielectric film 20, where the passivation layer 22 at least partially exposes the drain electrode D disposed on the top surface 16T and/or the sidewall 16S of the first insulating protrusion 16. In this embodiment, the thickness of the passivation layer 22 is less than the height of the first insulating protrusion 16, that is to say, the top surface 22T of the passivation layer 22 is lower than the top surface 16T of the first insulating protrusion 16, and thus the passivation layer 22 exposes the top surface 16T and a portion of the sidewall 16S of the first insulating protrusion 16. In an alternative embodiment, the thickness of the passivation layer 22 may be greater than the height of the first insulating protrusion 16, and the passivation layer 22 may have an indentation (depressed part or opening) partially exposing the drain electrode D disposed on the top surface 16T of the first insulating protrusion 16. Alternatively, the thickness of the passivation layer 22 may be substantially equal to the height of the first insulating protrusion 16, and the passivation layer 22 exposes the drain electrode D disposed on the top surface 16T of the first insulating protrusion 16. In this embodiment, the passivation layer 22 is able to protect the thin film transistor device TFT, and preferably has a planar top surface. The passivation layer 22 may be an organic dielectric layer, and the material is preferably selected from organic photosensitive material e.g. photoresist so the passivation layer 22 can be patterned by an exposure and development process. In addition, the passivation layer 22 may be a color filter layer e.g. a red color filter layer, a green color filter, a blue color filter layer or a color filter layer of another color.

As shown in FIGS. 5-6, a first electrode 24 is formed on the passivation layer 22 to form a pixel structure 30 of this embodiment. The first electrode 24 is in contact with and electrically connected to the drain electrode D exposed by the passivation layer 22. The first electrode 24 may be a pixel electrode, and the material may be indium tin oxide (ITO), indium zinc oxide (IZO) or other suitable transparent conductive materials or non-transparent conductive materials. In this embodiment, the first insulating protrusion 16 is formed prior to the passivation layer 22, and the drain electrode D is formed to cover the top surface 16T of the first insulating protrusion 16 prior to the passivation layer 22. Accordingly, the drain electrode D disposed on the top surface 16T of the first insulating protrusion 16 is inherently and certainly exposed after the passivation layer 22 is formed without requiring forming a contact hole to expose the drain electrode D, and the first electrode 24 can be in contact with and electrically connected to the drain electrode D disposed on the sidewall 16S of the first insulating protrusion 16. The first electrode 24 may be further in contact with and electrically connected to the drain electrode D disposed on the top surface 16T of the first insulating protrusion 16. The dimension of a contact hole of a passivation layer is at least between 20 micrometers and 25 micrometers, while the width of the bottom surface 16B of the first insulating protrusion 16 is, for example, between about 3 micrometers and 5 micrometers. Consequently, the pixel structure 30, which uses a first insulating protrusion 16 instead of a contact hole of the passivation layer, has improved aperture ratio and resolution.

Figure 7:
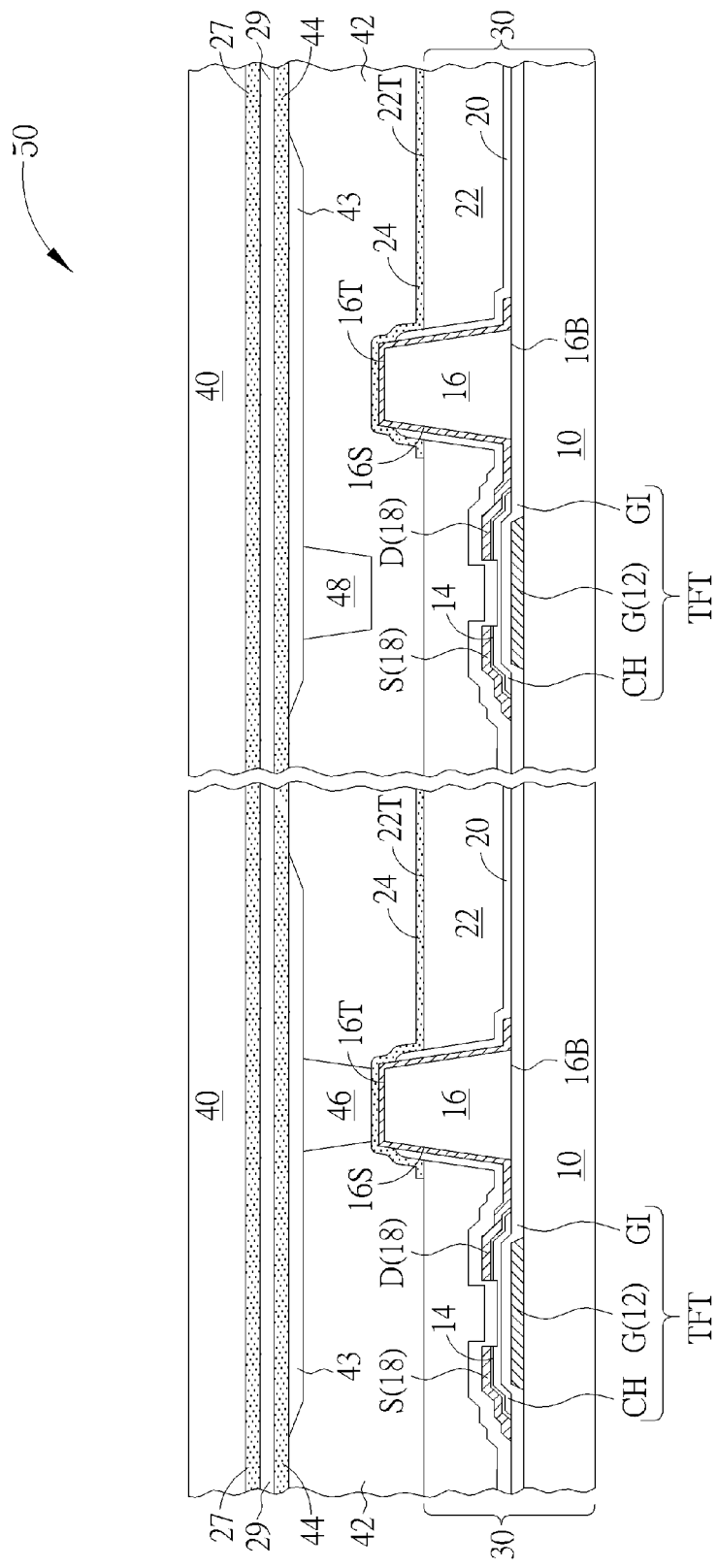
FIG. 7 is a schematic diagram illustrating a display panel according to a first embodiment of the present invention.

Refer to FIG. 7, as well as FIG. 6. FIG. 7 is a schematic diagram illustrating a display panel according to a first embodiment of the present invention. As shown in FIG. 7, the display panel 50 includes at least one pixel structure 30, a second substrate 40 and a display medium layer 42. The details of the pixel structure 30 are described in the above embodiment, and thus are not redundantly described. The second substrate 40 is disposed opposite to the first substrate 10. A light-shielding pattern 43 e.g. a black matrix (BM) may be further disposed on the second substrate 40. The material of the second substrate 40 and that of the first substrate 10 may be the same or different. When the passivation layer 22 of the pixel structure 30 is a color filter layer, it may not be required to form a color filter layer on the second substrate 40. When the passivation layer 22 of the pixel structure 30 is not a color filter layer, it may be required to form a color filter layer (not shown) on the second substrate 40. The display medium layer 42 is interposed between the first substrate 10 and the second substrate 40. In this embodiment, a vertical electric field type liquid crystal display panel is selected as an example, thus the display medium layer 42 is a liquid crystal layer, and a second electrode 44 is further disposed on the second substrate 40. The second electrode 44 is a common electrode having a common voltage, and the common voltage and a pixel voltage provided by the first electrode (pixel electrode) 24 may form a vertical electric filed for driving the display medium layer 42. In other alternative embodiments, the display panel 50 may be an electrophoretic display panel, an electrowetting display panel or other types of display panels, and the material of the display medium layer 42 may be electrophoretic material, electrowetting material or other suitable display medium materials. The display panel 50 of this embodiment may further include at least one main spacer 46 and at least one sub spacer 48, disposed between the first substrate 10 and the second substrate 40 e.g. on the second substrate 40. The main spacer 46 and the sub spacer 48 may have substantially the same height (thickness), but not limited thereto. The main spacer 46 may be disposed corresponding to/overlapping the first insulating protrusion 16, while the sub spacer 48 may be disposed corresponding to the thin film transistor device TFT, the gate line GL or the data line DL. In other words, the main spacer 46 overlaps the first insulating protrusion 16 and the sub spacer 48 overlaps the thin film transistor device TFT, the gate line GL or the data line DL. In this embodiment, since the top surface 22T of the passivation layer 22 is lower than the top surface 16T of the first insulating protrusion 16 and the main spacer 46 and the sub spacer 48 may have substantially the same height, the main spacer 46 may be in contact with both the first substrate 10 or the overlying layer of the first substrate 10 e.g. the first electrode 24 and the second substrate 40 or the overlying layer of the second substrate 40 e.g. the light-shielding pattern 43 to maintain a constant cell gap therebetween. On the other hand, the sub spacer 48 does not contact the first substrate 10 or the overlying layer e.g. the passivation layer 22 on normal condition (e.g. when the display panel 50 is not pressed), and the sub spacer 48 will be in contact with the first substrate 10 or the overlying layer e.g. the passivation layer 22 when being pressed by an external force or deformed due to other factors. In such a case, the sub spacer 48 is able to provide an auxiliary supporting function. The main spacer 46 and the sub spacer 48 may be disposed in the same pixel structure 30 or in different pixel structures 30, and the numbers and density of the main spacer 46 and the sub spacer 48 may be modified. In addition, the display panel 50 may optionally include a touch device 27 to provide touch input function. The touch device 27 may include a capacitive touch device, a resistive touch device, an optical touch device or other suitable types of touch devices. In this embodiment, the touch device 27 is a capacitive touch device including a plurality of sensing electrodes (e.g. transparent sensing electrodes), and the sensing electrodes may be made of a single-layered conductive pattern or a multi-layered stacking patterns. Furthermore, the touch device 27 is disposed on the surface of the second substrate 40 facing the first substrate 10 (i.e. the inner surface of the second substrate 40), and insulated from the second electrode 44 by an insulating layer 29, but not limited thereto. In other alternative embodiments, the touch device 27 may be disposed on the outer surface of the second substrate 40, or in advance disposed on another substrate which is then adhered to the outer surface of the second substrate 40.

The pixel structure and the display device are not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described. In addition, the display panel in all of the embodiments or alternative embodiments of the present invention may be equipped with a touch device to provide touch input function, and the types and locations of the touch device are described in the aforementioned embodiment, which are not redundantly described.

Figure 8:
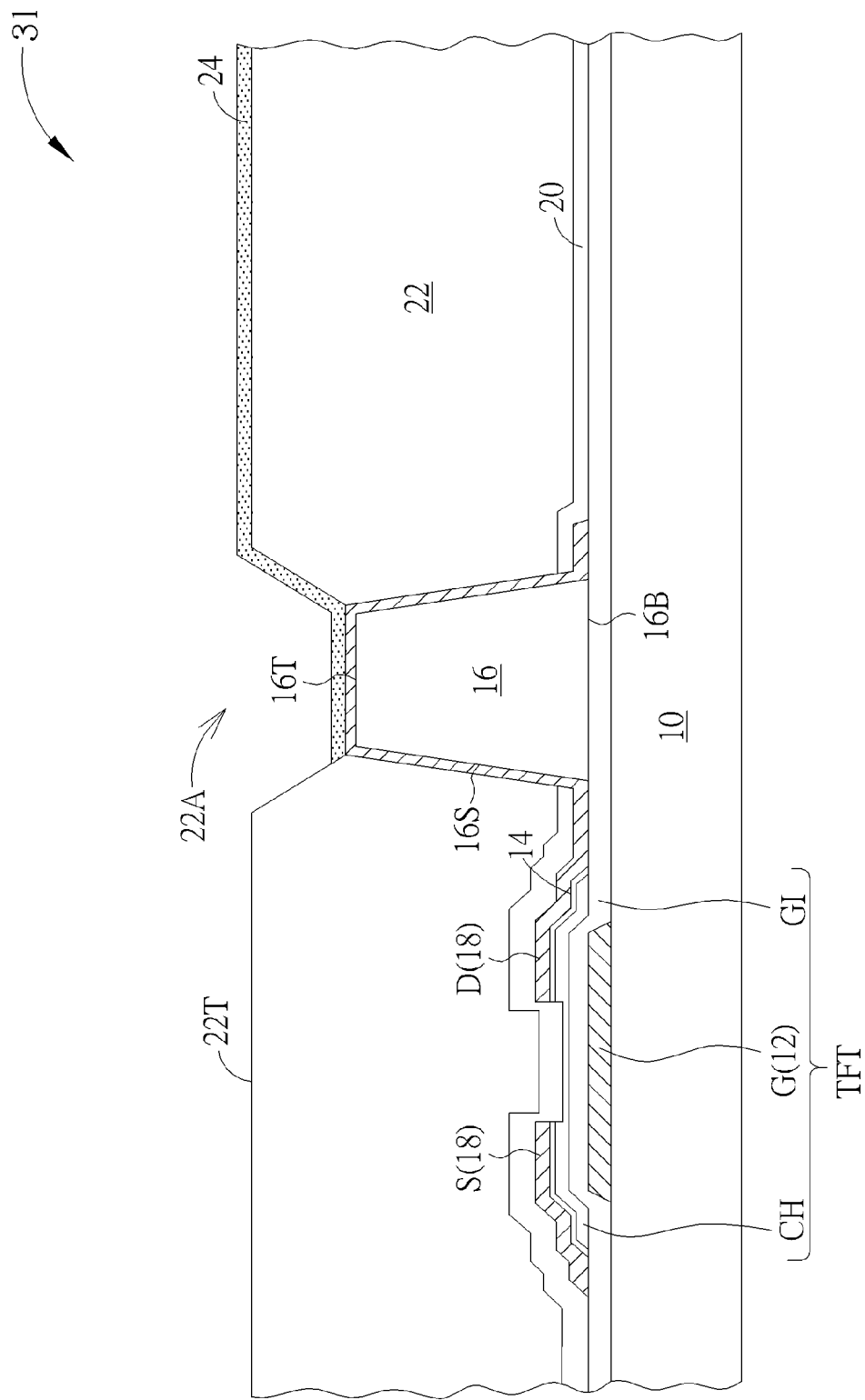
FIG. 8 is a schematic diagram illustrating a pixel structure according to a first alternative embodiment of the first embodiment of the present invention.

Refer to FIG. 8. FIG. 8 is a schematic diagram illustrating a pixel structure according to a first alternative embodiment of the first embodiment of the present invention. As shown in FIG. 8, different from the pixel structure of the first embodiment, in the pixel structure 31 of the first alternative embodiment, the thickness of the passivation layer 22 is greater than the height of the first insulating protrusion 16, i.e. the top surface 22T of the passivation layer 22 is higher than the top surface 16T of the first insulating protrusion 16. In addition, the passivation layer 22 has an indentation (depressed part or opening) 22A exposing the drain electrode D disposed on the top surface 16T of the first insulating protrusion 16, and the first electrode 24 is filled into the indentation 22A and electrically connected to the drain electrode D.

Figure 9:
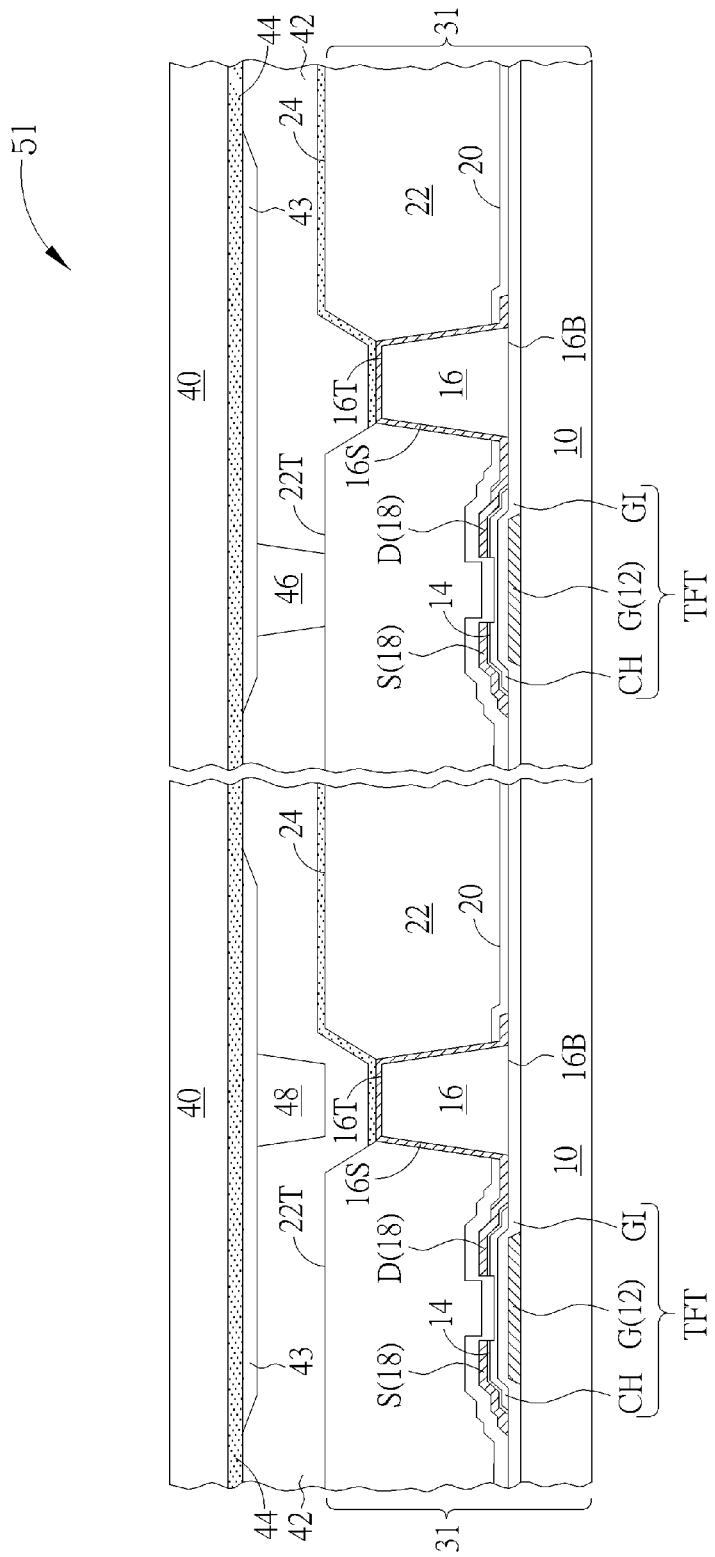
FIG. 9 is a schematic diagram illustrating a display panel according to a first alternative embodiment of the first embodiment of the present invention.

Refer to FIG. 9. FIG. 9 is a schematic diagram illustrating a display panel according to a first alternative embodiment of the first embodiment of the present invention. As shown in FIG. 9, the display panel 51 of the first alternative embodiment includes the aforementioned pixel structure 31, a second substrate 40 and a display medium layer 42. Different from the display panel of the first embodiment, in the first alternative embodiment, the top surface 22T of the passivation layer 22 is higher than the top surface 16T of the first insulating protrusion 16, the sub spacer 48 is disposed corresponding to the first insulating protrusion 16, and the main spacer 46 is disposed corresponding to the thin film transistor device TFT, the gate line (not shown) or the data line (not shown). In such a case, since the main spacer 46 and the sub spacer 48 have substantially the same height (thickness), the main spacer 46 may be in contact with both the first substrate 10 or the overlying layer of the first substrate 10 e.g. the passivation layer 22 and the second substrate 40 or the overlying layer of the second substrate 40 e.g. the light-shielding pattern 43 to maintain a constant cell gap between the first substrate 10 and the second substrate 40, while the sub spacer 48 is able to provide an auxiliary supporting function.

Figure 10:
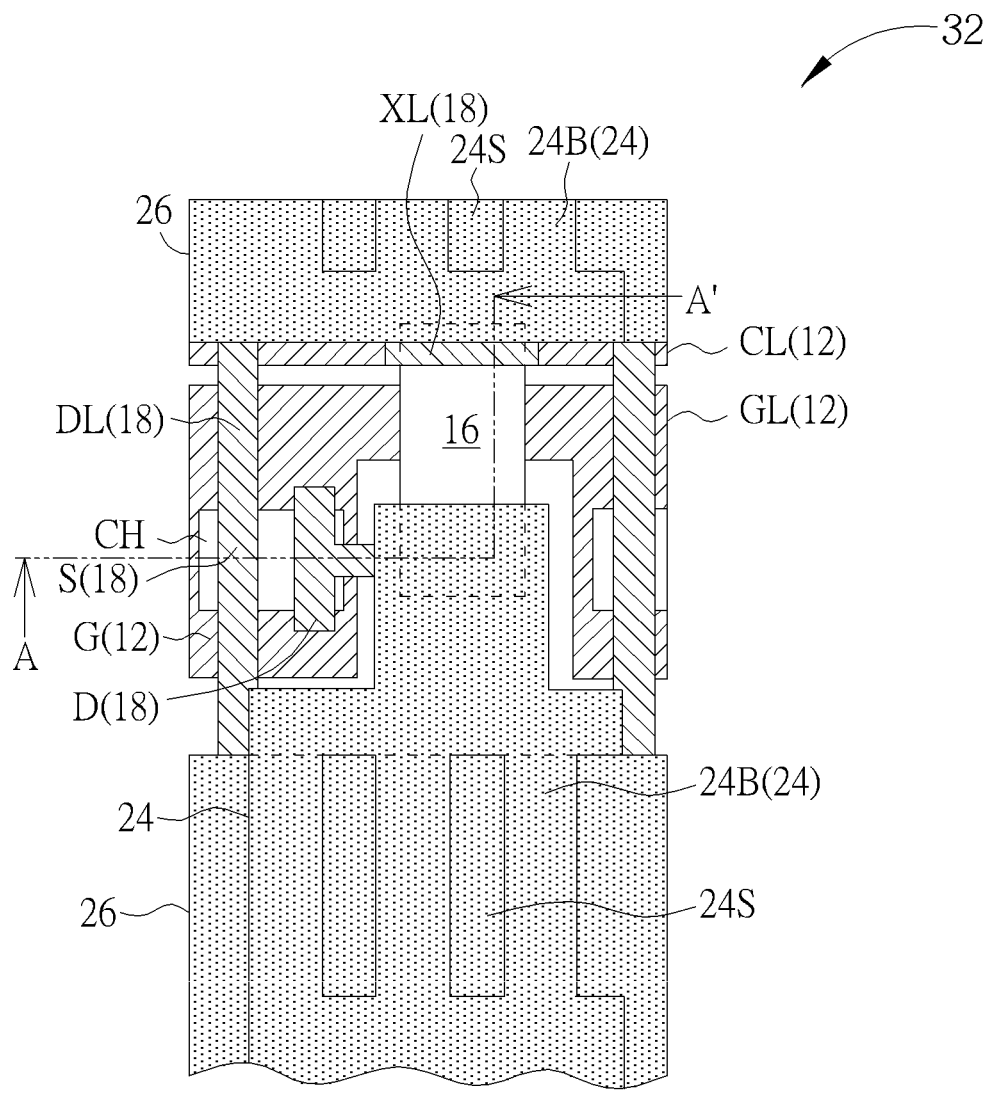
FIG. 10 is a top view of a pixel structure according to a second alternative embodiment of the first embodiment of the present invention.
Figure 11:
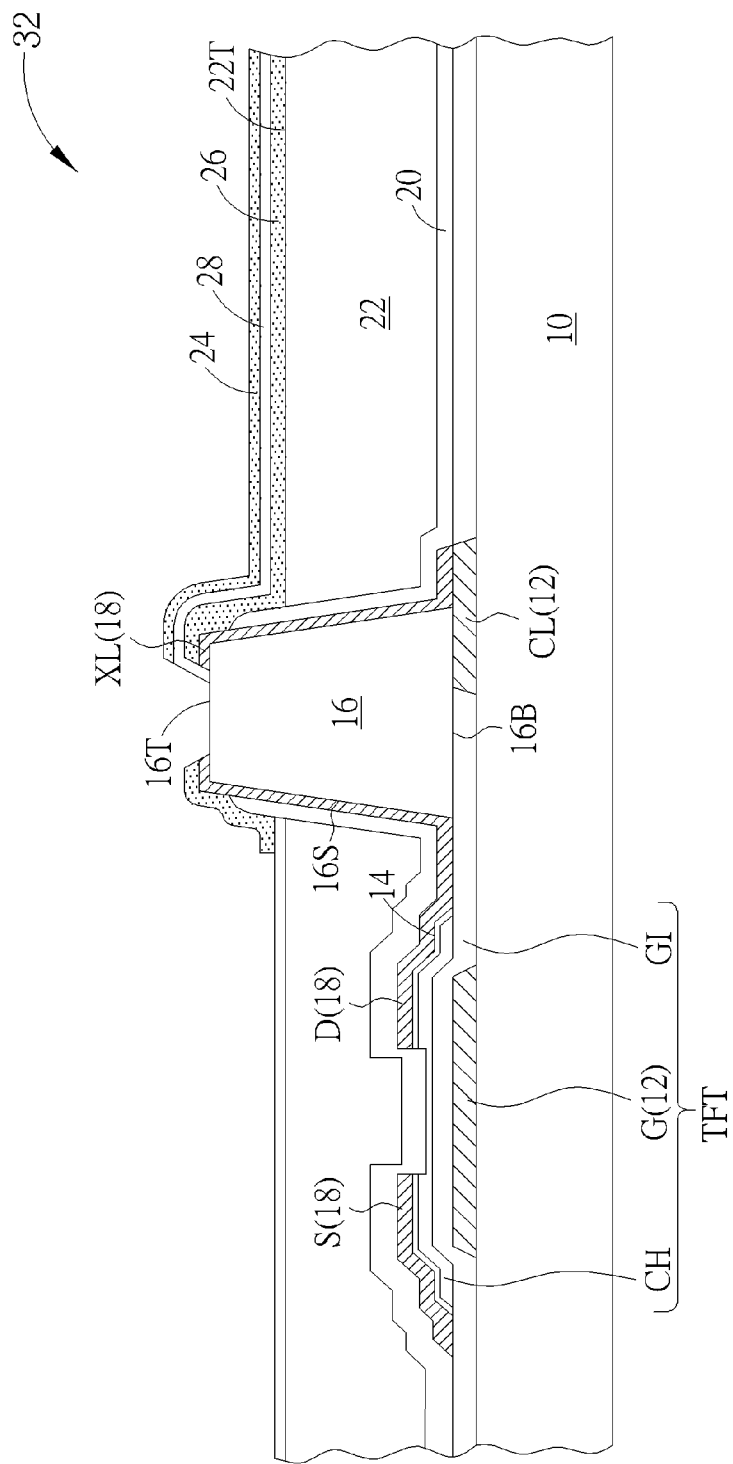
FIG. 11 is a cross-sectional view taken along a line A-A' of FIG. 10.

Refer to FIGS. 10-11. FIG. 10 is a top view of a pixel structure according to a second alternative embodiment of the first embodiment of the present invention, and FIG. 11 is a cross-sectional view taken along a line A-A' of FIG. 10. As shown in FIGS. 10-11, different from the pixel structure of the first alternative embodiment, in the pixel structure 32 of the second alternative embodiment, the drain electrode D only covers a portion of the sidewall 16S and a portion of the top surface 16T of the first insulating protrusion 16, but not limited thereto. In still another alternative embodiment, the drain electrode D may only cover a portion of the sidewall 16S of the first insulating protrusion 16, and does not cover the top surface 16T of the first insulating protrusion 16. In addition, the pixel structure 32 further includes a common line CL, a connecting line XL, a second electrode 26 and a second dielectric film 28. The common line CL is disposed on the first substrate 10 for providing a common voltage. The common line CL is disposed under the first insulating protrusion 16, and at least partially overlaps the first insulating protrusion 16, but not limited thereto. Furthermore, the common line CL may be a portion of the first patterned conductive layer 12, but not limited thereto. The connecting line XL and the common line CL are in contact with and electrically connected to each other, where the connecting line XL at least covers the other portion of the sidewall 16S and the other portion of the top surface 16T of the first insulating protrusion 16. The connecting line XL is covered by the first dielectric film 20, and electrically insulated from the drain electrode D i.e. the connecting line XL and the drain electrode D are not electrically connected to each other. The connecting line XL may be a portion of the second patterned conductive layer 18, but not limited thereto. The first dielectric film 20 and the passivation layer 22 at least expose the connecting line XL and the drain electrode D disposed on the top surface 16T of the first insulating protrusion 16. The second electrode 26 is disposed on the passivation layer 22. Specifically, the second electrode 26 is disposed between the first electrode 24 and the passivation layer 22, and electrically connected to the connecting line XL. The second electrode 26 is electrically connected to the common line CL through the connecting line XL, i.e. the connecting line XL is electrically connected between the second electrode 26 and the common line CL, and thus is provided with the common voltage. The second electrode 26 and the first electrode 24 may be made of the same material or different materials. The second dielectric film 28 is disposed between the first electrode 24 and the second electrode 26, and covers the second electrode 26 and the exposed connecting line XL to isolate the first electrode 24 from the second electrode 26. The pixel structure 32 of this embodiment may be a pixel structure of an in-plane electric field type LCD panel e.g. an in-plane switching (IPS) LCD panel or a fringe field switching (FFS) LCD panel, but not limited thereto. The first electrode 24 is served as a pixel electrode, the second electrode 26 is served as a common electrode having a constant voltage, and the first electrode 24 and the second electrode 26 are both disposed on the first substrate 10, but not limited thereto. In another alternative embodiment, the first electrode 24 may be a common electrode, while the second electrode 26 may be a pixel electrode which may be provided with different voltage signals. In addition, the first electrode 24 may include a plurality of branch electrodes 24B, and a slit 24S exists between two adjacent branch electrodes 24B. The second electrode 26 may be a planar electrode (full-surface electrode), or a patterned electrode having branch electrodes and slits. In addition, in the second alternative embodiment, the thickness of the passivation layer 22 is less than the height of the first insulating protrusion 16, i.e. the top surface 22T of the passivation layer 22 is lower than the top surface 16T of the first insulating protrusion 16 so the passivation layer 22 exposes the top surface 16T and a portion of the sidewall 16S of the first insulating protrusion 16, but not limited thereto. In another alternative embodiment, the thickness of the passivation layer 22 may be greater than the height of the first insulating protrusion 16, and the passivation layer 22 may have an indentation (depressed part or opening) at least exposing the drain electrode D disposed on the top surface 16T of the first insulating protrusion 16.

Figure 12:
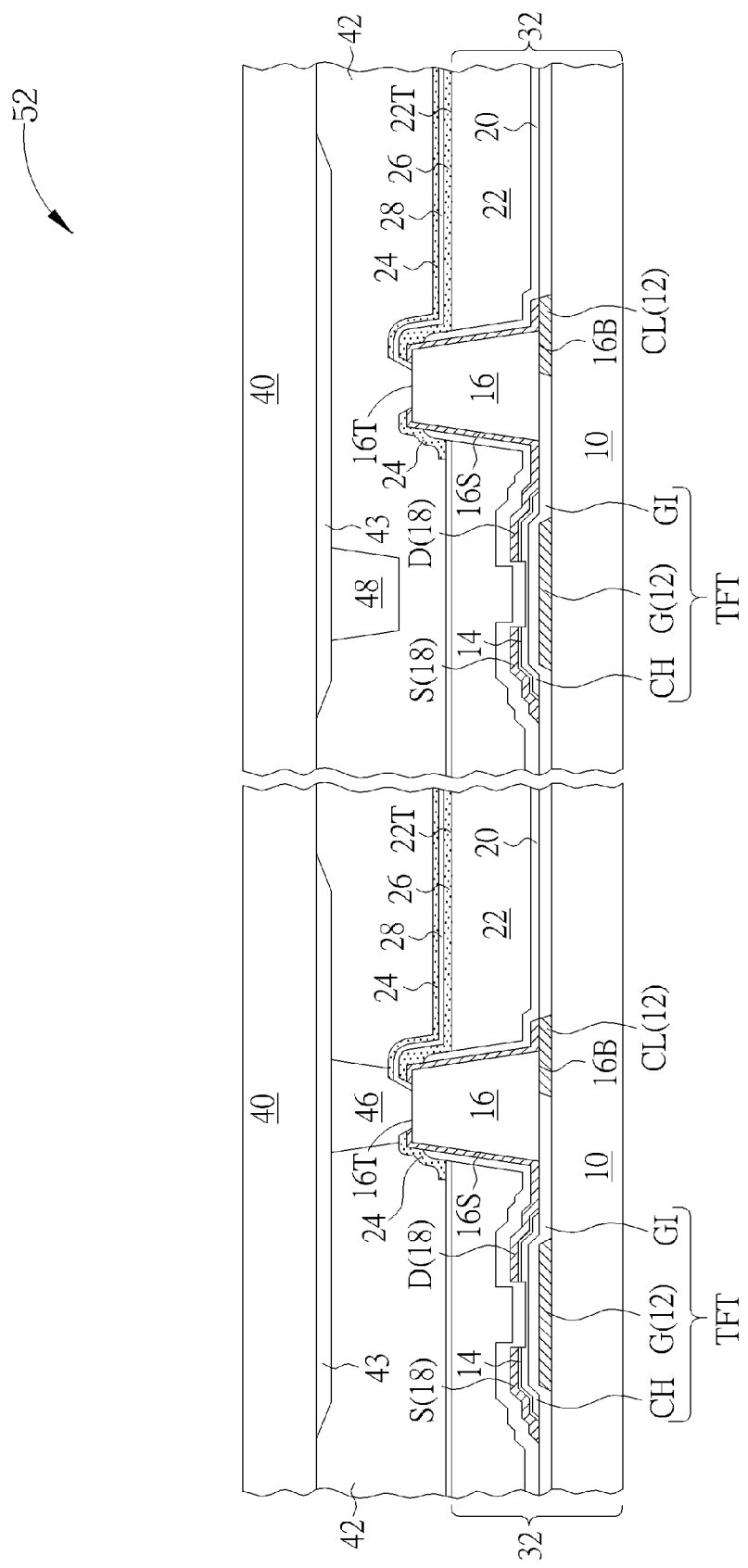
FIG. 12 is a schematic diagram illustrating a display panel according to a second alternative embodiment of the first embodiment of the present invention.

Refer to FIG. 12. FIG. 12 is a schematic diagram illustrating a display panel according to a second alternative embodiment of the first embodiment of the present invention. As shown in FIG. 12, the display panel 52 of the second alternative embodiment is an in-plane electric field type LCD display panel, which includes the aforementioned pixel structure 32, a second substrate 40 and a display medium layer 42. In the second alternative embodiment, since the top surface 22T of the passivation layer 22 is lower than the top surface 16T of the first insulating protrusion 16, the main spacer 46 is disposed corresponding to the first insulating protrusion 16, and the sub spacer 48 is disposed corresponding to the thin film transistor device TFT, the gate line (not shown) or the data line (not shown). In such a case, since the main spacer 46 and the sub spacer 48 have substantially the same height (thickness), the main spacer 46 may be in contact with both the first substrate 10 or the overlying layer of the first substrate 10 e.g. the first electrode 24 and the second substrate 40 or the overlying layer of the second substrate 40 e.g. the light-shielding pattern 43 to maintain a constant cell gap between the first substrate 10 and the second substrate 40, while the sub spacer 48 is able to provide an auxiliary supporting function.

Figure 13:
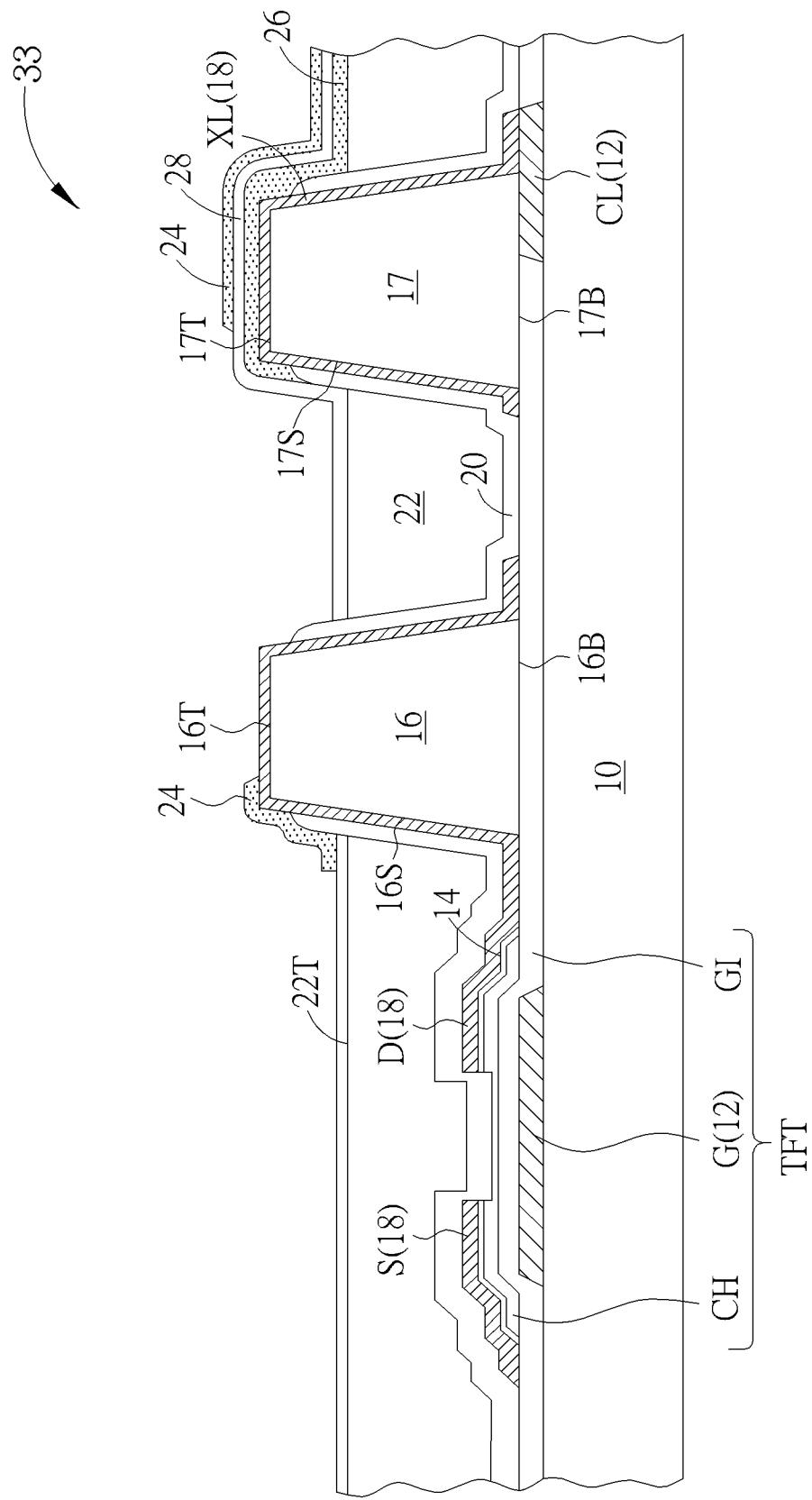
FIG. 13 is a schematic diagram of a pixel structure according to a third alternative embodiment of the first embodiment of the present invention.

Refer to FIG. 13. FIG. 13 is a schematic diagram of a pixel structure according to a third alternative embodiment of the first embodiment of the present invention. As shown in FIG. 13, different from the pixel structure of the second alternative embodiment, the pixel structure 33 of the third alternative embodiment further includes a second insulating protrusion 17 disposed on the first substrate 10. The second insulating protrusion 17 has a sidewall 17S, a top surface 17T and a bottom surface 17B. The common line CL is disposed on the first substrate 10 and under the second insulating protrusion 17, and the common line CL may partially overlap the second insulating protrusion 17, but not limited thereto. For example, the bottom surface 17B of the second insulating protrusion 17 may be in contact with the common line CL. The first insulating protrusion 16 and the second insulating protrusion 17 may have substantially the same height, and formed by the same material and the same process. The drain electrode D at least covers a portion of the sidewall 16S and a portion of the top surface 16T of the first insulating protrusion 16. In this embodiment, the drain electrode D entirely covers the sidewall 16S and the top surface 16T of the first insulating protrusion 16, but not limited thereto. In another alternative embodiment, the drain electrode D may only cover a portion of the sidewall 16S and a portion of the top surface 16T of the first insulating protrusion 16, or may only cover a portion of the sidewall 16S. In addition, the connecting line XL is in contact with and electrically connected to the common line CL, where the connecting line XL at least covers a portion of the sidewall 17S and a portion of the top surface 17T of the second insulating protrusion 17. In this embodiment, the connecting line XL entirely covers the sidewall 17S and the top surface 17T of the second insulating protrusion 17, but not limited thereto. In another alternative embodiment, the connecting line XL may only cover a portion of the sidewall 17S and a portion of the top surface 17T of the second insulating protrusion 17, or may only cover a portion of the sidewall 17S of the second insulating protrusion 17. Furthermore, the first dielectric film 20 and the passivation layer 22 at least expose the connecting line XL disposed on the top surface 17T of the second insulating protrusion 17. The first electrode 24 is disposed on the passivation layer 22 and electrically connected to the drain electrode D exposed by the passivation layer 22 and the first dielectric film 20. The second electrode 26 is disposed on the passivation layer 22 and under the first electrode 24, i.e. disposed between the passivation layer 22 and the first electrode 24, and the second electrode 26 is in contact with and electrically connected to the connecting line XL. The second dielectric film 28 is disposed between the first electrode 24 and the second electrode 26 to isolate the first electrode 24 from the second electrode 26. In the third alternative embodiment, the thickness of the passivation layer 22 is less than the height of the first insulating protrusion 16 and the second insulating protrusion 17, i.e. the top surface 22T of the passivation layer 22 is lower than the top surface 16T of the first insulating protrusion 16 and the top surface 17T of the second insulating protrusion 17. Accordingly, the passivation layer 22 exposes the top surface 16T and a portion of the sidewall 16S of the first insulating protrusion 16, and the top surface 17T and a portion of the sidewall 17S of the second insulating protrusion 17, but not limited thereto. In another alternative embodiment, the thickness of the passivation layer 22 may be greater than the height of the first insulating protrusion 16 and the height of the second insulating protrusion 17, and the passivation layer 22 may have at least one indentation (depressed part or opening) at least partially exposing the drain electrode D disposed on the top surface 16T of the first insulating protrusion 16 and at least partially exposing the connecting line XL disposed on the top surface 17T of the second insulating protrusion 17.

Figure 14:
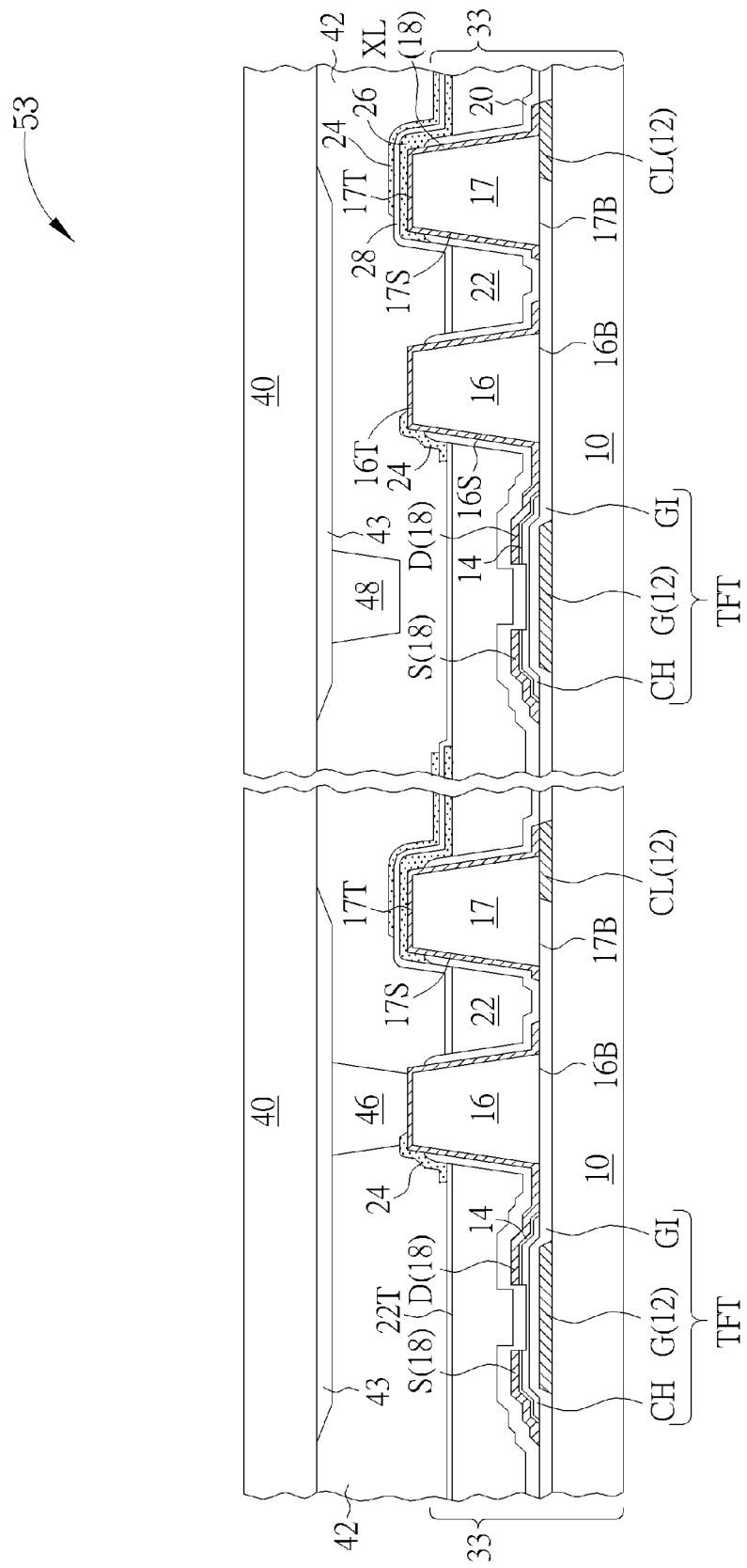
FIG. 14 is a schematic diagram illustrating a display panel according to a third alternative embodiment of the first embodiment of the present invention.

Refer to FIG. 14. FIG. 14 is a schematic diagram illustrating a display panel according to a third alternative embodiment of the first embodiment of the present invention. As shown in FIG. 14, the display panel 53 of the third alternative embodiment is an in-plane electric field type LCD display panel, which includes the aforementioned pixel structure 33, a second substrate 40 and a display medium layer 42. In the third alternative embodiment, since the top surface 22T of the passivation layer 22 is lower than the top surface 16T of the first insulating protrusion 16, the main spacer 46 is disposed corresponding to the first insulating protrusion 16 and/or the second insulating protrusion 17, and the sub spacer 48 is disposed corresponding to the thin film transistor device TFT, the gate line (not shown) or the data line (not shown). In such a case, since the main spacer 46 and the sub spacer 48 have substantially the same height (thickness), the main spacer 46 may be in contact with both the first substrate 10 or the overlying layer of the first substrate 10 e.g. the first electrode 24 and the second substrate 40 or the overlying layer of the second substrate 40 e.g. the light-shielding pattern 43 to maintain a constant cell gap between the first substrate 10 and the second substrate 40, while the sub spacer 48 is able to provide an auxiliary supporting function.

Figure 15:
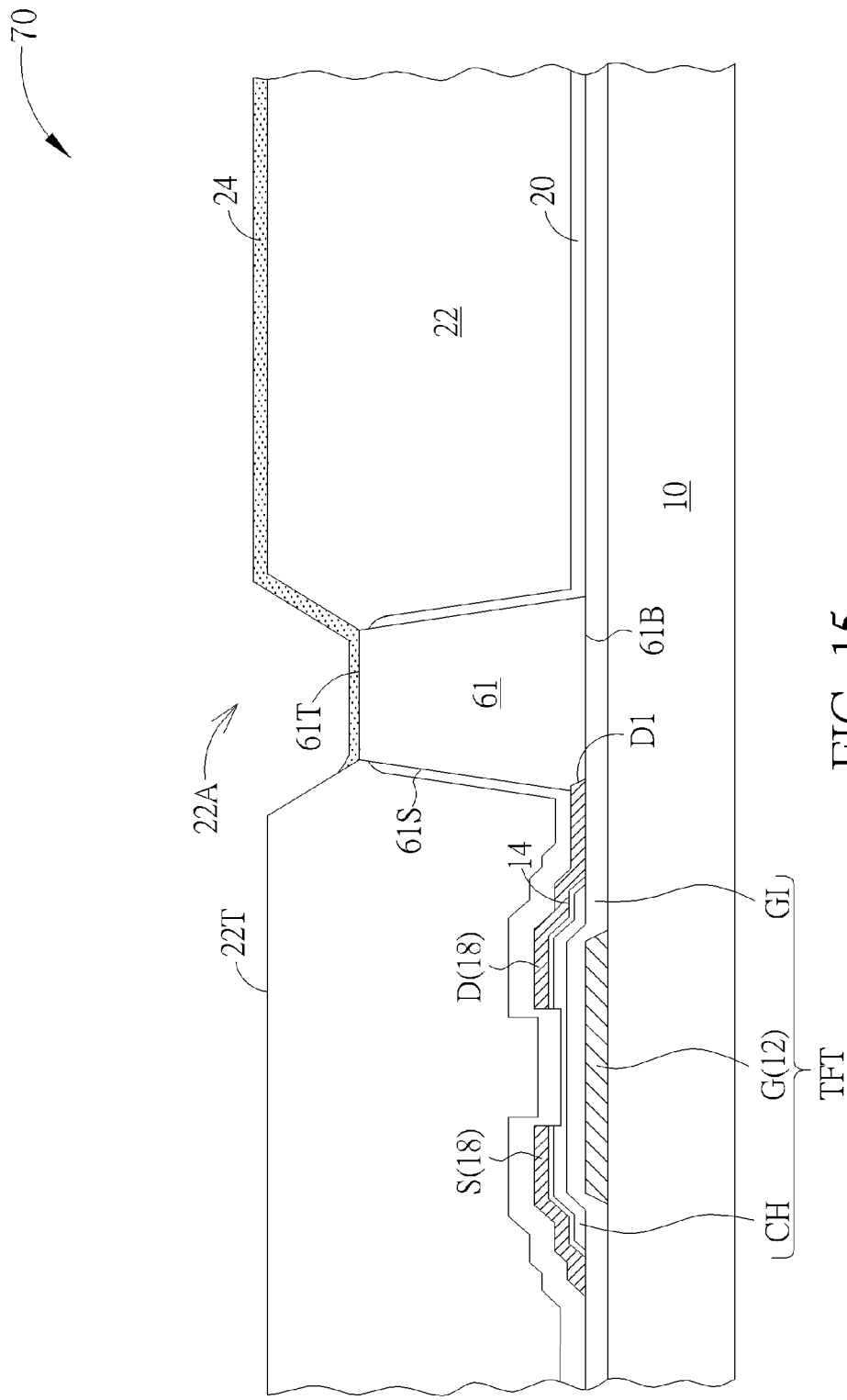
FIG. 15 is a schematic diagram illustrating a pixel structure according to a second embodiment of the present invention.

Refer to FIG. 15. FIG. 15 is a schematic diagram illustrating a pixel structure according to a second embodiment of the present invention. As shown in FIG. 15, the pixel structure 70 of this embodiment includes a first substrate, a thin film transistor device TFT, a first single-layered conductive protrusion 61, a first dielectric film 20, a passivation layer 22 and a first electrode 24. The thin film transistor device TFT is disposed on the first substrate 10, and the thin film transistor device TFT includes a gate electrode G, an active layer CH, a gate insulating layer GI, two heavily doped semiconductor layers 14, a source electrode S and a drain electrode D. The first single-layered conductive protrusion 61 is disposed on the first substrate 10. The first single-layered conductive protrusion 61 has a sidewall 61S, a bottom surface 61B and a top surface 61T, and the first single-layered conductive protrusion 61 is in contact with and electrically connected to the drain electrode D. In this embodiment, the area of the bottom surface 61B of the first single-layered conductive protrusion 61 may be greater than the area of the top surface 61T of the first single-layered conductive protrusion 61, and the sidewall 61S is an inclined sidewall, i.e. the cross-sectional shape of the first single-layered conductive protrusion 61 is approximately a trapezoid shape, but not limited thereto. In addition, a portion of the first single-layered conductive protrusion 61 is located on and contacts the drain electrode D, or a portion of the bottom surface 61B is in contact with the drain electrode D, while the other portion of the bottom surface 61B is not in contact with the drain electrode D. The first single-layered conductive protrusion 61 is in contact with a side surface D1 of the drain electrode D, or the single-layered conductive protrusion 61 covers a portion of the drain electrode D, but not limited thereto. The single-layered conductive protrusion 61 is a single-layered conductive structure formed by a single-layered conductive material, instead of multi-layered stacking conducting materials. Accordingly, the single-layered conductive protrusion 61 has lower and uniform resistance, and the fabrication process is simple. The material of the single-layered conductive protrusion 61 may be a single conductive material or a plurality of conductive materials. For example, the material of the single-layered conductive protrusion 61 may be metal or alloy e.g. gold (Au), silver (Ag), aluminum (Al), titanium (Ti) and molybdenum (Mo), or metal oxide e.g. indium tin oxide (ITO), indium zinc oxide (IZO) or other suitable conductive material. The first dielectric film 20 is disposed on the first substrate 10. The first dielectric film 20 covers the thin film transistor device TFT and partially exposes the first single-layered conductive protrusion 61. For example, the first dielectric film 20 at least covers a portion of the sidewall 61S of the first single-layered conductive protrusion 61 and exposes the top surface 61T of the first single-layered conductive protrusion 61, and the bottom surface 61B the first single-layered conductive protrusion 61 is in contact with the gate insulating layer GI. The passivation layer 22 is disposed on the first dielectric film 20, and the passivation layer 22 at least partially exposes the first single-layered conductive protrusion 61. The first electrode 24 is disposed on the passivation layer 22 and electrically connected to the first single-layered conductive protrusion 61 exposed by the passivation layer 22. In this embodiment, the thickness of the passivation layer 22 is greater than the height of the first single-layered conductive protrusion 61, i.e. the top surface 22T of the passivation layer 22 is higher than the top surface 61T of the first single-layered conductive protrusion 61. The passivation layer 22, however, has an indentation (depressed part or opening) 22A partially exposing the top surface 61T of the first single-layered conductive protrusion 61, and the first electrode 26 is filled into the indentation 22A, in contact with and electrically connected to the first single-layered conductive protrusion 61.

Different from the first embodiment in which the drain electrode D is extended to the first insulating protrusion 16, the second embodiment uses the first single-layered conductive protrusion 61 as an electrical connection interface to electrically connect the drain electrode D and the first electrode (pixel electrode) 24 without requiring a contact hole. In this embodiment, the width (e.g. the maximum width) of the drain electrode D is substantially between 3 micrometers and 5 micrometers, and the width (e.g. the maximum width) of the bottom surface 61B of the first single-layered conductive protrusion 61 is substantially between 3 micrometers and 5 micrometers. Compared with the size of a contact hole (ranging from 20 micrometers to 25 micrometers), the pixel structure 70 that uses the first single-layered conductive protrusion 61 has significantly increased aperture ratio and resolution, and the first single-layered conductive protrusion 61 has better conductivity.

Figure 16:
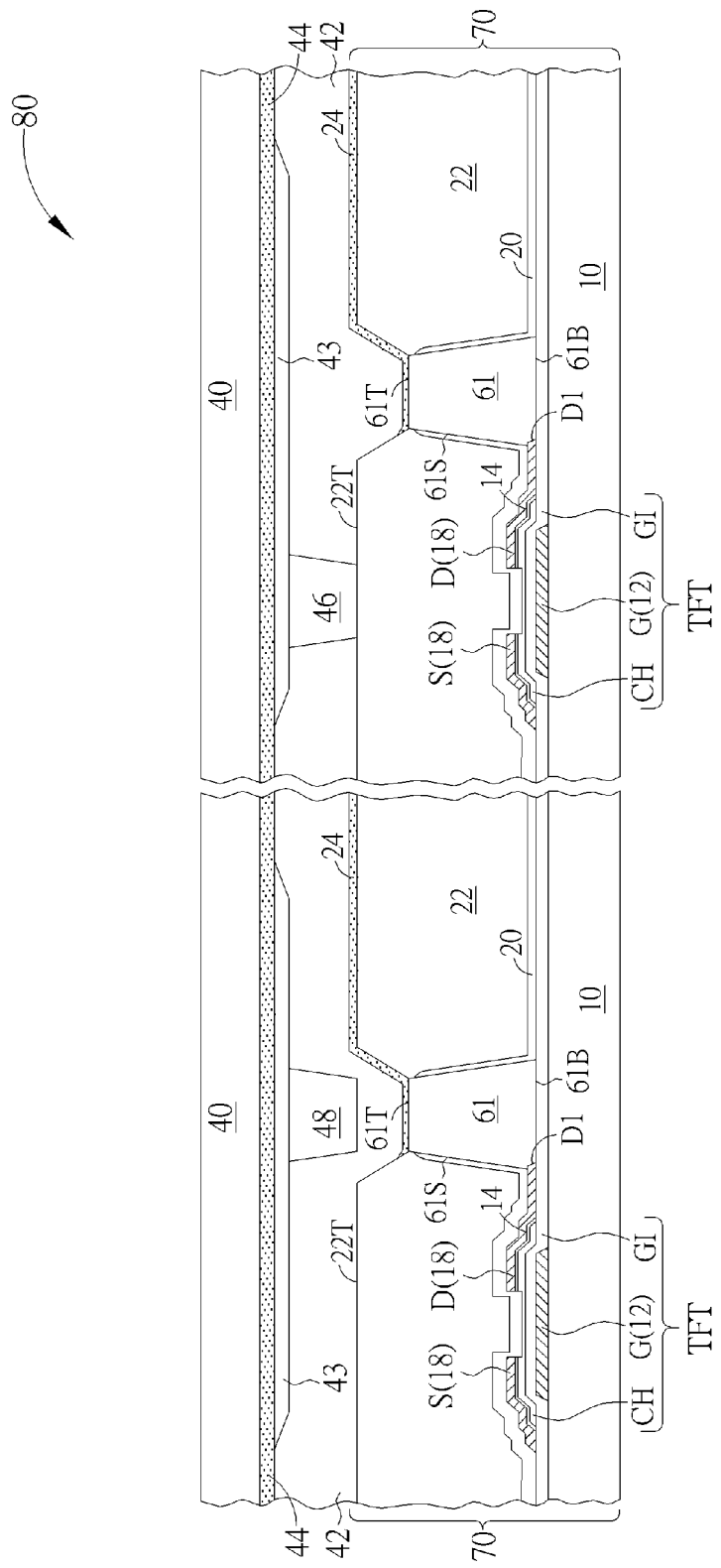
FIG. 16 is a schematic diagram illustrating a display panel according to a second embodiment of the present invention.

Refer to FIG. 16. FIG. 16 is a schematic diagram illustrating a display panel according to a second embodiment of the present invention. As shown in FIG. 16, the display panel 80 of this embodiment includes at least one pixel structure 70, a second substrate 40 and a display medium layer 42. The details of the pixel structure 70 are described in the above embodiment, and thus are not redundantly described. The second substrate 40 is disposed opposite to the first substrate 10. A light-shielding pattern 43 e.g. a black matrix (BM) may be further disposed on the second substrate 40. The material of the second substrate 40 and that of the first substrate 10 may be the same or different. When the passivation layer 22 of the pixel structure 70 is a color filter layer, it may not be required to form a color filter layer on the second substrate 40. When the passivation layer 22 of the pixel structure 70 is not a color filter layer, it may be required to forma color filter layer (not shown) on the second substrate 40. The display medium layer 42 is interposed between the first substrate 10 and the second substrate 40. In this embodiment, a vertical electric field type liquid crystal display panel is selected as an example, thus the display medium layer 42 is a liquid crystal layer, and a second electrode 44 is further disposed on the second substrate 40. The second electrode 44 is a common electrode having a common voltage, and the common voltage and a pixel voltage provided by the first electrode (pixel electrode) 24 may form a vertical electric filed for driving the display medium layer 42. In other alternative embodiments, the display panel 80 may be an electrophoretic display panel, an electrowetting display panel or other types of display panels, and the material of the display medium layer 42 may be electrophoretic material, electrowetting material or other suitable display medium materials. The display panel 80 of this embodiment may further include at least one main spacer 46 and at least one sub spacer 48, disposed between the first substrate 10 and the second substrate 40 e.g. on the second substrate 40. The main spacer 46 and the sub spacer 48 may have substantially the same height (thickness), but not limited thereto. The sub spacer 48 may be disposed corresponding to the first single-layered conductive protrusion 61, while the main spacer 46 may be disposed corresponding to the thin film transistor device TFT, the gate line (not shown) or the data line (not shown). In such a case, since the main spacer 46 and the sub spacer 48 have substantially the same height (thickness), the main spacer 46 may be in contact with both the first substrate 10 or the overlying layer of the first substrate 10 e.g. the passivation layer 22 and the second substrate 40 or the overlying layer of the second substrate 40 e.g. the light-shielding pattern 43 to maintain a constant cell gap between the first substrate 10 and the second substrate 40, while the sub spacer 48 is able to provide an auxiliary supporting function.

Figure 17:
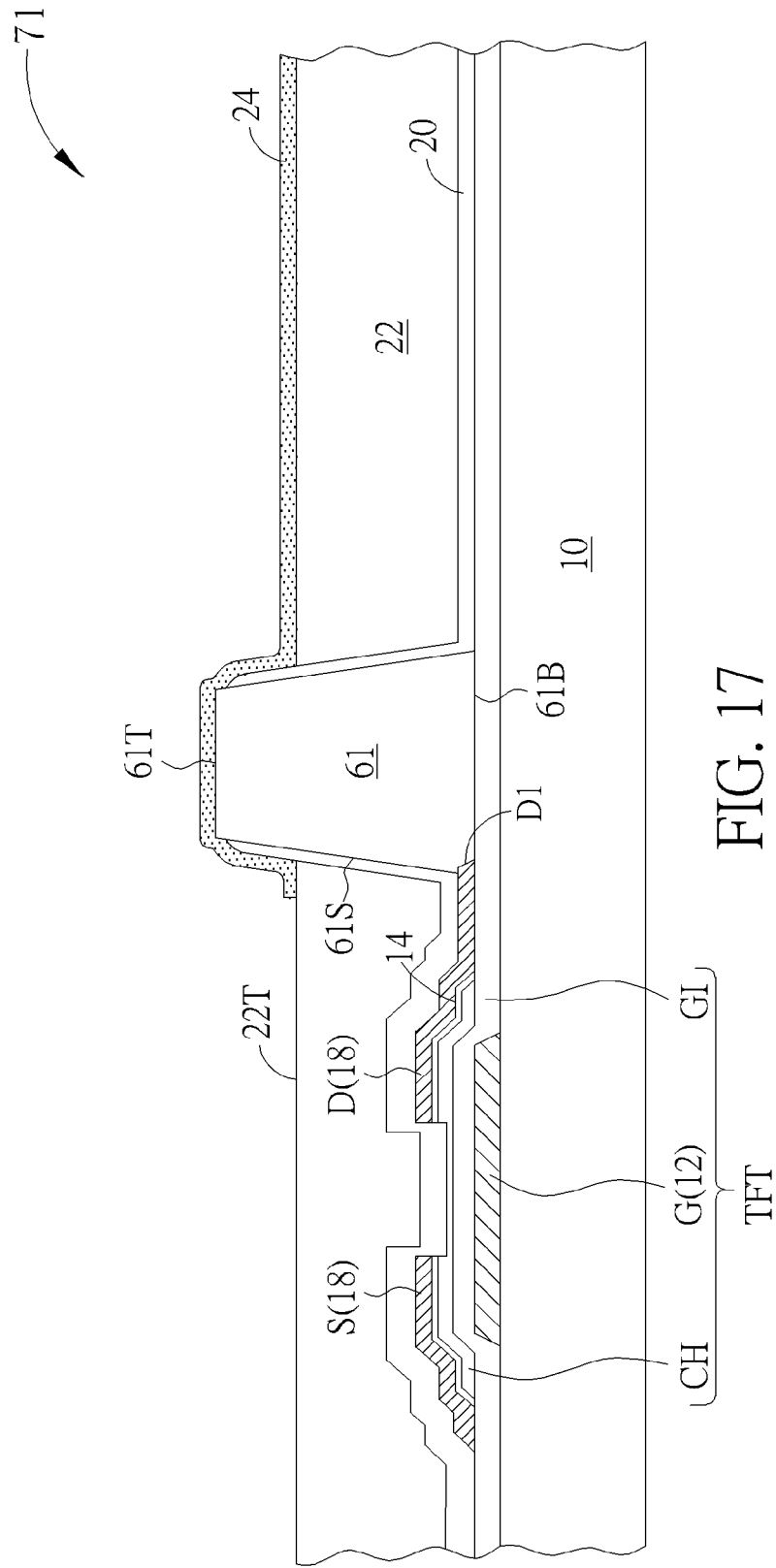
FIG. 17 is a schematic diagram illustrating a pixel structure according to a first alternative embodiment of the second embodiment of the present invention.

Refer to FIG. 17. FIG. 17 is a schematic diagram illustrating a pixel structure according to a first alternative embodiment of the second embodiment of the present invention. As shown in FIG. 17, in the pixel structure 71 of the first alternative embodiment, the thickness of the passivation layer 22 is less than the height of the first single-layered conductive protrusion 61, i.e. the top surface 22T of the passivation layer 22 is lower than the top surface 61T of the first single-layered conductive protrusion 61 so the passivation layer 22 exposes the top surface 61T and a portion of the sidewall 61S of the first single-layered conductive protrusion 61, but not limited thereto. Alternatively, the thickness of the passivation layer 22 may be substantially equal to the height of the first single-layered conductive protrusion 61, and the passivation layer 22 exposes the top surface 61T of the first single-layered conductive protrusion 61.

Figure 18:
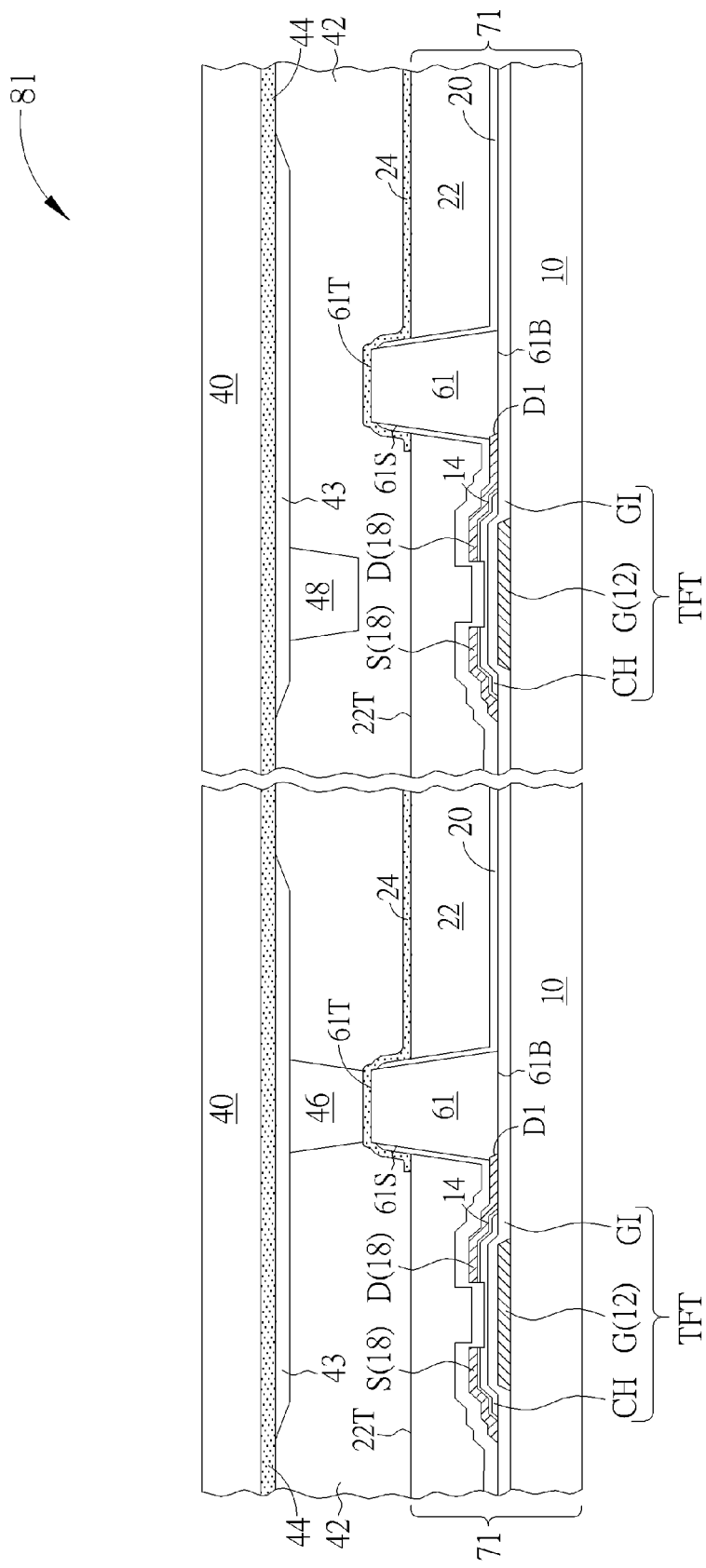
FIG. 18 is a schematic diagram illustrating a display panel according to a first alternative embodiment of the second embodiment of the present invention.

Refer to FIG. 18. FIG. 18 is a schematic diagram illustrating a display panel according to a first alternative embodiment of the second embodiment of the present invention. As shown in FIG. 18, the display panel 81 of the first alternative embodiment includes the aforementioned pixel structure 71, a second substrate 40 and a display medium layer 42. Different from the display panel of the second embodiment, in the first alternative embodiment, the top surface 22T of the passivation layer 22 is lower than the top surface 61T of the first single-layered conductive protrusion 61, the main spacer 46 is disposed corresponding to the first single-layered conductive protrusion 61, and the sub spacer 48 is disposed corresponding to the thin film transistor device TFT, the gate line (not shown) or the data line (not shown). In such a case, since the main spacer 46 and the sub spacer 48 have substantially the same height (thickness), the main spacer 46 may be in contact with both the first substrate 10 or the overlying layer of the first substrate 10 e.g. the first electrode 24 and the second substrate 40 or the overlying layer of the second substrate 40 e.g. the light-shielding pattern 43 to maintain a constant cell gap between the first substrate 10 and the second substrate 40, while the sub spacer 48 is able to provide an auxiliary supporting function.

Figure 19:
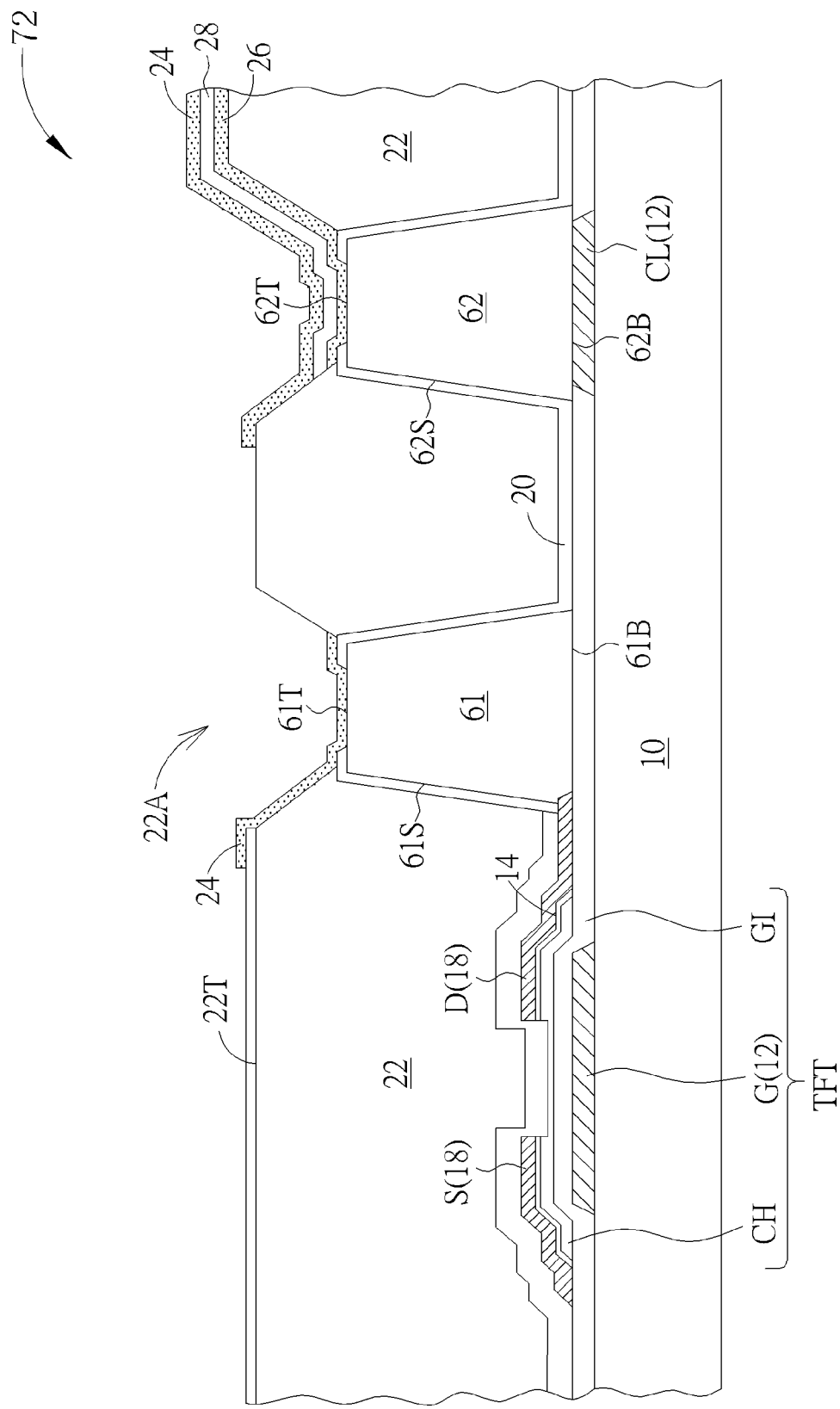
FIG. 19 is a schematic diagram of a pixel structure according to a second alternative embodiment of the second embodiment of the present invention.

Refer to FIG. 19. FIG. 19 is a schematic diagram of a pixel structure according to a second alternative embodiment of the second embodiment of the present invention. As shown in FIG. 19, different from the pixel structure of the second embodiment, the pixel structure of the second alternative embodiment includes a first single-layered conductive protrusion 61, a second single-layered conductive protrusion 62, a common line CL, a first electrode 24, a second electrode 26 and a second dielectric film 28. The second single-layered conductive protrusion 62 is disposed on the first substrate 10, and the second single-layered conductive protrusion 62 has a sidewall 62S, a top surface 62T and a bottom surface 62B. The common line CL is disposed on the first substrate 10 and electrically connected to the second single-layered conductive protrusion 62 for providing a common voltage. The common line CL may be disposed under the second single-layered conductive protrusion 62, in contact with the bottom surface 62B of the second single-layered conductive protrusion 62 and at least partially overlaps the second single-layered conductive protrusion 62, but not limited thereto. The common line CL may be a portion of the first patterned conductive layer 12, but not limited thereto. The first dielectric film 20 and the passivation layer 22 at least expose the top surface 61T of the first single-layered conductive protrusion 61 and the top surface 62T of the second single-layered conductive protrusion 62. The first electrode 24 is disposed on the passivation layer 22 and electrically connected to the first single-layered conductive protrusion 61 exposed by the passivation layer 22. The second electrode 26 is disposed on the passivation layer 22 and under the first electrode 24, and electrically connected to the second single-layered conductive protrusion 62 exposed by the first dielectric film 20 and the passivation layer 22. The second electrode 26 is electrically connected to the common line CL through the second single-layered conductive protrusion 62, and thus has the common voltage. The second electrode 26 and the first electrode 24 may be made of the same material or different materials. The second dielectric film 28 is disposed between the first electrode 24 and the second electrode 26 to isolate the first electrode 24 from the second electrode 26.

The pixel structure 72 of this embodiment may be a pixel structure of an in-plane electric field type LCD panel e.g. an in-plane switching (IPS) LCD panel or a fringe field switching (FFS) LCD panel, but not limited thereto. The first electrode 24 is served as a pixel electrode, the second electrode 26 is served as a common electrode, and the first electrode 24 and the second electrode 26 are both disposed on the first substrate 10, but not limited thereto. In addition, the first electrode 24 may include a plurality of branch electrodes (not shown), and a slit (not shown) exists between two adjacent branch electrodes. The second electrode 26 may be a planar electrode (full-surface electrode) overlapping the first electrode 24, or a patterned electrode having branch electrodes and slits. In addition, in the second alternative embodiment, the thickness of the passivation layer 22 is greater than the height of the first single-layered conductive protrusion 61 and the height of the second single-layered conductive protrusion 62, and the passivation layer 22 has an indentation (depressed part or opening) 22A at least exposing the first single-layered conductive protrusion 61 and the second single-layered conductive protrusion 62. In another alternative embodiment, the thickness of the passivation layer 22 may be less than the height of the first single-layered conductive protrusion 61 and the height of the second single-layered conductive protrusion 62.

Figure 20:
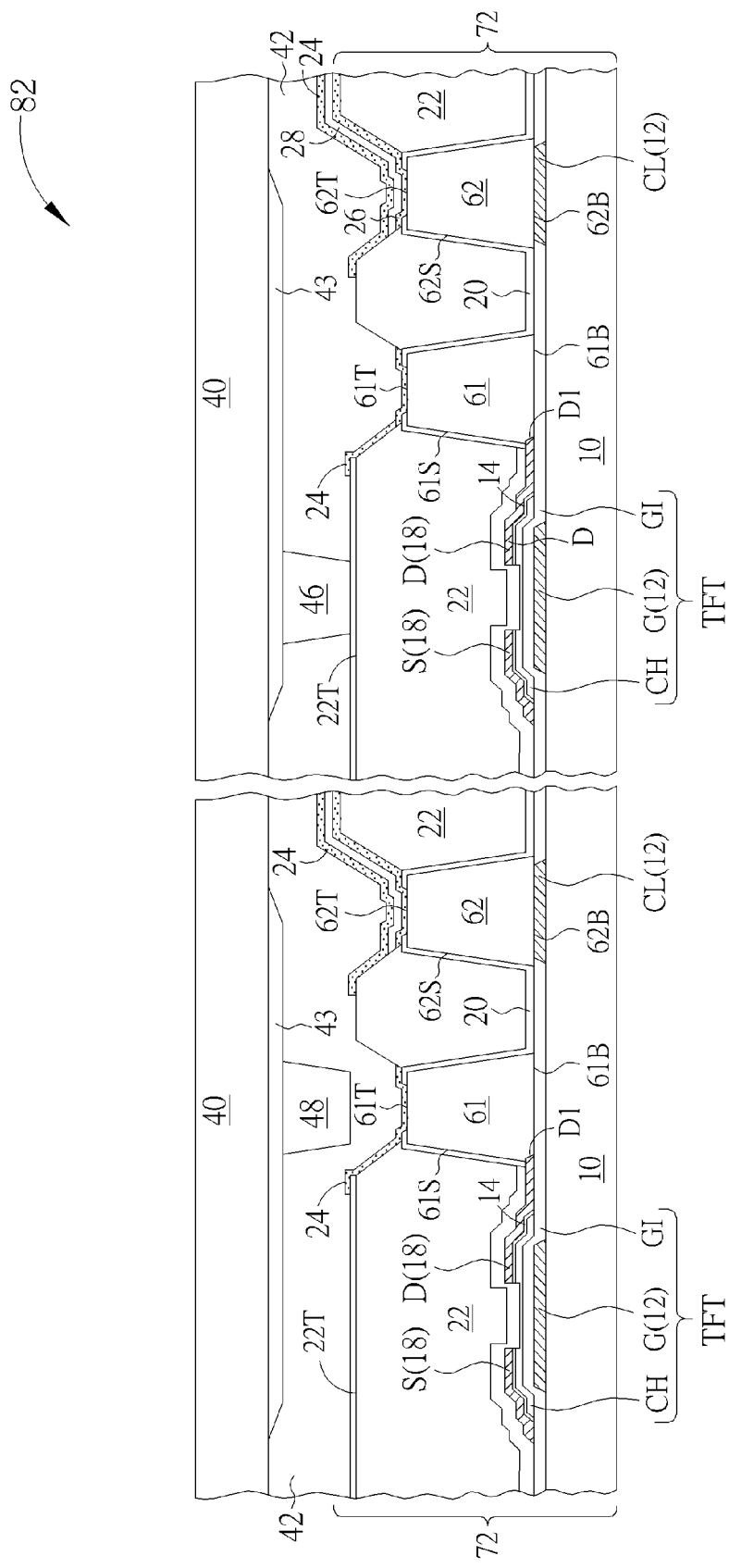
FIG. 20 is a schematic diagram illustrating a display panel according to a second alternative embodiment of the second embodiment of the present invention.

Refer to FIG. 20. FIG. 20 is a schematic diagram illustrating a display panel according to a second alternative embodiment of the second embodiment of the present invention. As shown in FIG. 20, the display panel 82 of the second alternative embodiment is an in-plane electric field type LCD display panel, which includes the aforementioned pixel structure 72, a second substrate 40 and a display medium layer 42. In the second alternative embodiment, since the top surface 22T of the passivation layer 22 is higher than the top surface 61T of the first single-layered conductive protrusion 61 and the top surface 62T of the second single-layered conductive protrusion 62, the sub spacer 48 is disposed corresponding to the first single-layered conductive protrusion 61 or the second single-layered conductive protrusion 62, while the main spacer 46 is disposed corresponding to the thin film transistor device TFT, the gate line (not shown) or the data line (not shown). In such a case, since the main spacer 46 and the sub spacer 48 have substantially the same height (thickness), the main spacer 46 may be in contact with both the first substrate 10 or the overlying layer of the first substrate 10 e.g. the second dielectric film 28 and the second substrate 40 or the overlying layer of the second substrate 40 e.g. the light-shielding pattern 43 to maintain a constant cell gap between the first substrate 10 and the second substrate 40, while the sub spacer 48 is able to provide an auxiliary supporting function. In another alternative embodiment, the thickness of the passivation layer 22 may be less than the height of the first single-layered conductive protrusion 61 and the height of the second single-layered conductive protrusion 62.

In conclusion, the pixel structure and the display panel of the present invention use an insulating protrusion with extending drain electrode or a single-layered conductive protrusion as an electrical connection interface between the pixel electrode and the drain electrode, which does not require formation of contact hole in the passivation and thus can significantly increase the aperture ratio and resolution.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A pixel structure, comprising:
   a first substrate;
   a thin film transistor device, disposed on the first substrate, the thin film transistor device including a gate electrode, an active layer, a gate insulating layer, a source electrode and a drain electrode;
   a first insulating protrusion, disposed on the first substrate, wherein the first insulating protrusion has a sidewall and a top surface, and the drain electrode at least covers a portion of the sidewall of the first insulating protrusion;
   a first dielectric film, disposed on the first substrate, wherein the first dielectric film covers the thin film transistor device and exposes a portion of the drain electrode;
   a passivation layer, disposed on the first dielectric film, wherein the passivation layer and the first dielectric film at least partially exposes the drain electrode disposed on the sidewall of the first insulating protrusion; and
   a first electrode, disposed on the passivation layer and electrically connected to the drain electrode exposed by the passivation layer.

2. The pixel structure of claim 1, wherein the first dielectric film further at least covers a portion of the sidewall of the first insulating protrusion, the first insulating protrusion is in contact with the gate insulating layer, and the drain electrode further covers a portion of the top surface of the first insulating protrusion.

3. The pixel structure of claim 1, further comprising:
   a common line, disposed on the first substrate;
   a connecting line, electrically connected to the common line, wherein the connecting line at least covers a portion of the sidewall of the first insulating protrusion, the first dielectric film and the passivation layer at least expose the connecting line disposed on the sidewall of the first insulating protrusion, and the connecting line is electrically isolated from the drain electrode;
   a second electrode, disposed on the passivation layer and electrically connected to the connecting line exposed by the first dielectric film and the passivation layer; and
   a second dielectric film, disposed between the first electrode and the second electrode.

4. The pixel structure of claim 3, wherein the connecting line further covers at least a portion of the top surface of the first insulating protrusion.

5. The pixel structure of claim 1, further comprising:
   a second insulating protrusion, disposed on the first substrate, wherein the second insulating protrusion has a sidewall and a top surface;
   a common line, disposed on the first substrate;
   a connecting line, electrically connected to the common line, wherein the connecting line at least covers a portion of the sidewall and a portion of the top surface of the second insulating protrusion, and the first dielectric film and the passivation layer at least expose the connecting line disposed on the top surface of the second insulating protrusion;
   a second electrode, disposed on the passivation layer and electrically connected to the connecting line exposed by the first dielectric film and the passivation layer; and
   a second dielectric film, disposed between the first electrode and the second electrode for isolating the first electrode from the second electrode.

6. The pixel structure of claim 5, wherein the first insulating protrusion and the second insulating protrusion substantially have a same height.

7. A display panel, comprising:
   the pixel structure of claim 1;
   a second substrate, disposed opposite to the first substrate; and
   a display medium layer, interposed between the first substrate and the second substrate.

8. The display panel of claim 7, further comprising:
   a main spacer, disposed between the first substrate and the second substrate; and
   a sub spacer, disposed on the second substrate, wherein the main spacer and the sub spacer substantially have a same height, a top surface of the passivation layer is lower than the top surface of the first insulating protrusion, and the main spacer is disposed corresponding to the first insulating protrusion.

9. The display panel of claim 7, further comprising:
   a main spacer, disposed between the first substrate and the second substrate; and
   a sub spacer, disposed on the second substrate, wherein the main spacer and the sub spacer substantially have a same height, a top surface of the passivation layer is higher than the top surface of the first insulating protrusion, and the sub spacer is disposed corresponding to the first insulating protrusion.

10. The display panel of claim 7, further comprising a touch device, disposed on the second substrate.

11. A pixel structure, comprising:
    a first substrate;
    a thin film transistor device, disposed on the first substrate, the thin film transistor device comprising a gate electrode, an active layer, a gate insulating layer, a source electrode and a drain electrode;
    a first single-layered conductive protrusion, disposed on the first substrate, wherein the first single-layered conductive protrusion has a sidewall, a bottom surface and a top surface, and the first single-layered conductive protrusion is electrically connected to the drain electrode;
    a first dielectric film, disposed on the first substrate, wherein the first dielectric film covers the thin film transistor device and partially exposes the first single-layered conductive protrusion;
    a passivation layer, disposed on the first dielectric film, wherein the passivation layer at least partially exposes the first single-layered conductive protrusion; and
    a first electrode, disposed on the passivation layer and electrically connected to the first single-layered conductive protrusion exposed by the passivation layer.

12. The pixel structure of claim 11, wherein a portion of the bottom surface of the first single-layered conductive protrusion is not in contact with the drain electrode, the first single-layered conductive protrusion is in contact with a side surface of the drain electrode, a width of the drain electrode is between 3 micrometers and 5 micrometers, and a width of the bottom surface of the first single-layered conductive protrusion is between 3 micrometers and 5 micrometers.

13. The pixel structure of claim 11, wherein the first dielectric film further at least covers a portion of the sidewall of the first single-layered conductive protrusion and exposes the top surface of the first single-layered conductive protrusion, and the first single-layered conductive protrusion is in contact with the gate insulating layer.

14. The pixel structure of claim 11, wherein the passivation layer comprises a color filter layer or an organic dielectric layer.

15. The pixel structure of claim 11, further comprising:
a second single-layered conductive protrusion, disposed on the first substrate, wherein the second single-layered conductive protrusion has a sidewall and a top surface;
a common line, disposed on the first substrate and electrically connected to the second single-layered conductive protrusion, wherein the first dielectric film and the passivation layer at least partially expose the second single-layered conductive protrusion;
a second electrode, disposed on the passivation layer and electrically connected to the second single-layered conductive protrusion exposed by the first dielectric film and the passivation layer; and
a second dielectric film, disposed between the first electrode and the second electrode.

16. The pixel structure of claim 15, wherein the first single-layered conductive protrusion and the second single-layered conductive protrusion substantially have a same height.

17. A display panel, comprising:
the pixel structure of claim 11;
a second substrate, disposed opposite to the first substrate; and
a display medium layer, interposed between the first substrate and the second substrate.

18. The display panel of claim 17, further comprising:
a main spacer, disposed between the first substrate and the second substrate; and
a sub spacer, disposed on the second substrate, wherein the main spacer and the sub spacer substantially have a same height, a top surface of the passivation layer is lower than the top surface of the first single-layered conductive protrusion, and the main spacer is disposed corresponding to the first single-layered conductive protrusion.

19. The display panel of claim 17, further comprising:
a main spacer, disposed between the first substrate and the second substrate; and
a sub spacer, disposed on the second substrate, wherein the main spacer and the sub spacer substantially have a same height, a top surface of the passivation layer is higher than the top surface of the first single-layered conductive protrusion, and the sub spacer is disposed corresponding to the first single-layered conductive protrusion.

20. The display panel of claim 17, further comprising a touch device, disposed on the second substrate.

* * * * *